US010235242B2

(12) United States Patent
Wright et al.

(10) Patent No.: US 10,235,242 B2
(45) Date of Patent: Mar. 19, 2019

(54) FAULT TOLERANT MEMORY SYSTEMS AND COMPONENTS WITH INTERCONNECTED AND REDUNDANT DATA INTERFACES

(71) Applicant: Rambus Inc., Sunnyvale, CA (US)

(72) Inventors: Kenneth L. Wright, Sunnyvale, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 187 days.

(21) Appl. No.: 15/260,880

(22) Filed: Sep. 9, 2016

(65) Prior Publication Data

US 2017/0091040 A1 Mar. 30, 2017

Related U.S. Application Data

(60) Provisional application No. 62/233,550, filed on Sep. 28, 2015.

(51) Int. Cl.
| | |
|---|---|
| *G06F 11/00* | (2006.01) |
| *G06F 11/14* | (2006.01) |
| *H01L 23/00* | (2006.01) |
| *G06F 3/06* | (2006.01) |

(Continued)

(52) U.S. Cl.
CPC .......... *G06F 11/142* (2013.01); *G06F 3/0617* (2013.01); *G06F 3/0634* (2013.01); *G06F 3/0656* (2013.01); *G06F 3/0659* (2013.01); *G06F 3/0683* (2013.01); *G06F 11/00* (2013.01); *G06F 13/1673* (2013.01); *G06F 13/4068* (2013.01); *H01L 24/17* (2013.01); *H01L 24/48* (2013.01); *G06F 2201/805* (2013.01);

(Continued)

(58) Field of Classification Search
CPC .. G06F 11/142; G06F 11/201; G06F 11/2002; G06F 11/2017; G06F 3/0617; G06F 3/0634; G06F 3/0683

See application file for complete search history.

(56) References Cited

U.S. PATENT DOCUMENTS

| 5,943,287 A | * | 8/1999 | Walton | G11C 29/70 365/230.03 |
|---|---|---|---|---|
| 6,742,098 B1 | | 5/2004 | Halbert et al. | |
| 6,889,304 B2 | | 5/2005 | Perego et al. | |

(Continued)

FOREIGN PATENT DOCUMENTS

| WO | WO-2016-089563 A1 | 6/2016 |
|---|---|---|
| WO | WO-2016-099665 A1 | 6/2016 |

(Continued)

*Primary Examiner* — Philip Guyton
(74) *Attorney, Agent, or Firm* — Silicon Edge Law Group LLP; Arthur J. Behiel

(57) ABSTRACT

A memory system includes dynamic random-access memory (DRAM) components that include interconnected and redundant component data interfaces. The redundant interfaces facilitate memory interconnect topologies that accommodate considerably more DRAM components per memory channel than do traditional memory systems, and thus offer considerably more memory capacity per channel, without concomitant reductions in signaling speeds. The memory components can be configured to route data around defective data connections to maintain full capacity and continue to support memory transactions.

20 Claims, 15 Drawing Sheets

(51) Int. Cl.
  *G06F 13/16* (2006.01)
  *G06F 13/40* (2006.01)

(52) U.S. Cl.
  CPC .................. *G06F 2201/82* (2013.01); *H01L 2924/00014* (2013.01); *H01L 2924/1436* (2013.01)

(56) References Cited

U.S. PATENT DOCUMENTS

| | | | |
|---|---|---|---|
| 7,464,225 B2 | 12/2008 | Tsern | |
| 7,526,597 B2 | 4/2009 | Perego et al. | |
| 7,539,800 B2* | 5/2009 | Dell | G06F 11/104 710/100 |
| 9,165,639 B2 | 10/2015 | Ware et al. | |
| 9,232,651 B2 | 1/2016 | Ware et al. | |
| 9,489,323 B2 | 11/2016 | Amirkhany et al. | |
| 9,841,916 B2* | 12/2017 | Cho | G06F 3/0638 |
| 2006/0020740 A1* | 1/2006 | Bartley | G06F 11/2007 711/100 |
| 2006/0277355 A1 | 12/2006 | Ellsberry et al. | |
| 2008/0155149 A1* | 6/2008 | de Araujo | G06F 11/2007 710/107 |
| 2016/0034371 A1* | 2/2016 | Oh | G06F 3/0619 714/6.2 |
| 2016/0085653 A1* | 3/2016 | Li | G06F 11/1076 714/6.3 |

FOREIGN PATENT DOCUMENTS

| | | | |
|---|---|---|---|
| WO | WO-2016-144521 A1 | 9/2016 | |
| WO | WO-2016-145328 A2 | 9/2016 | |

\* cited by examiner

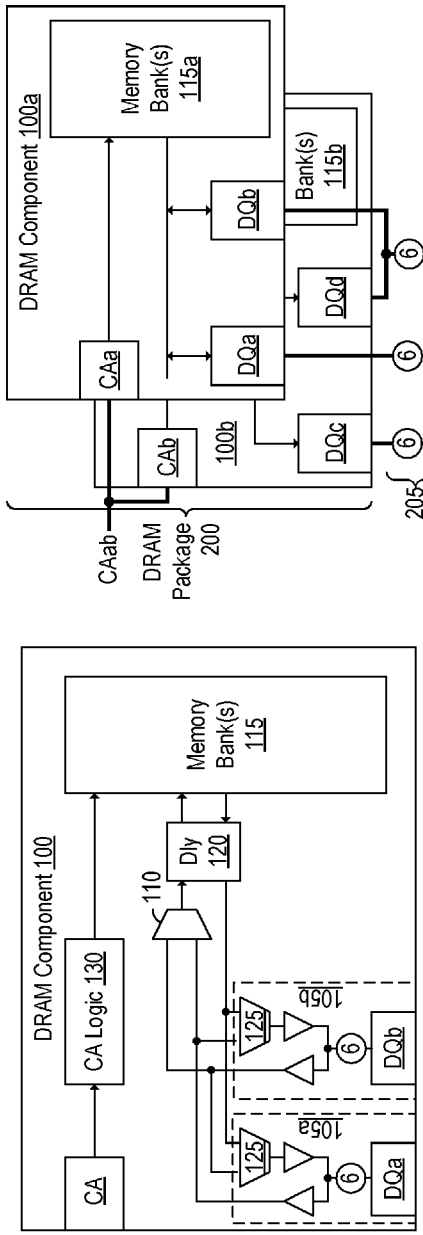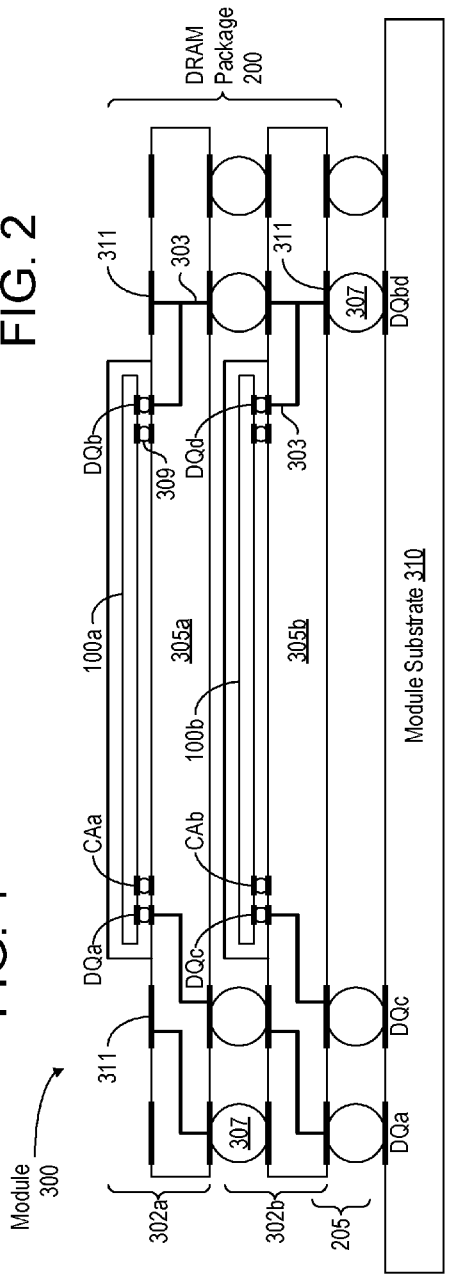

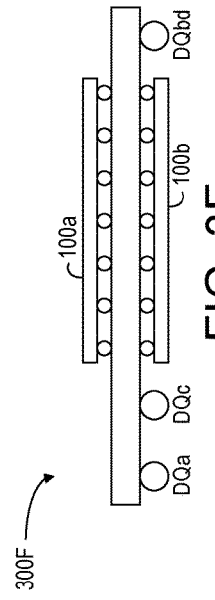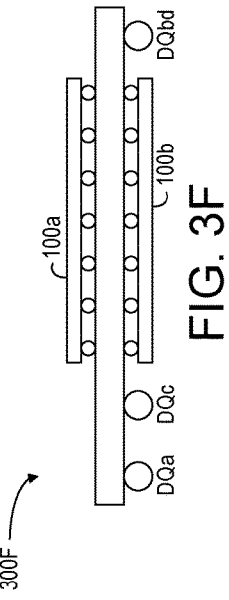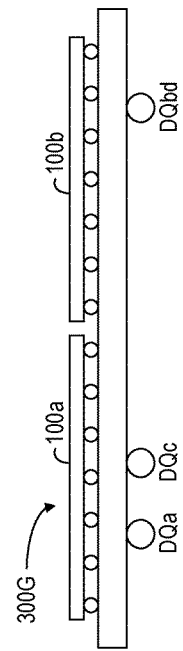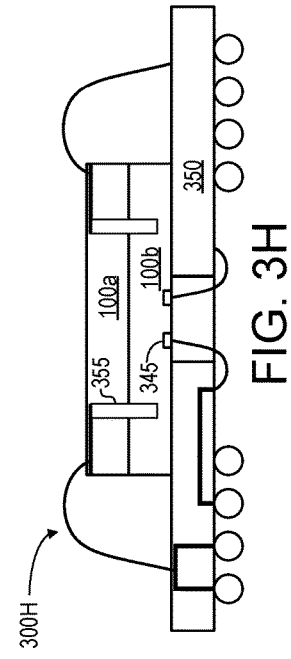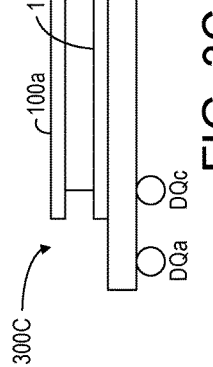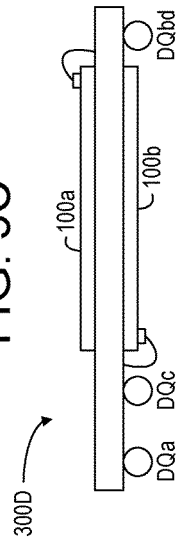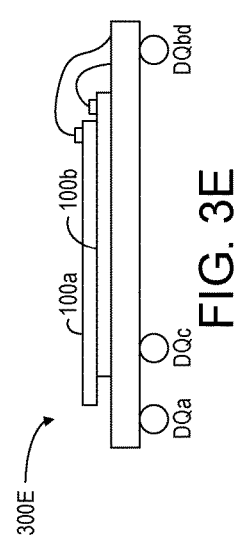

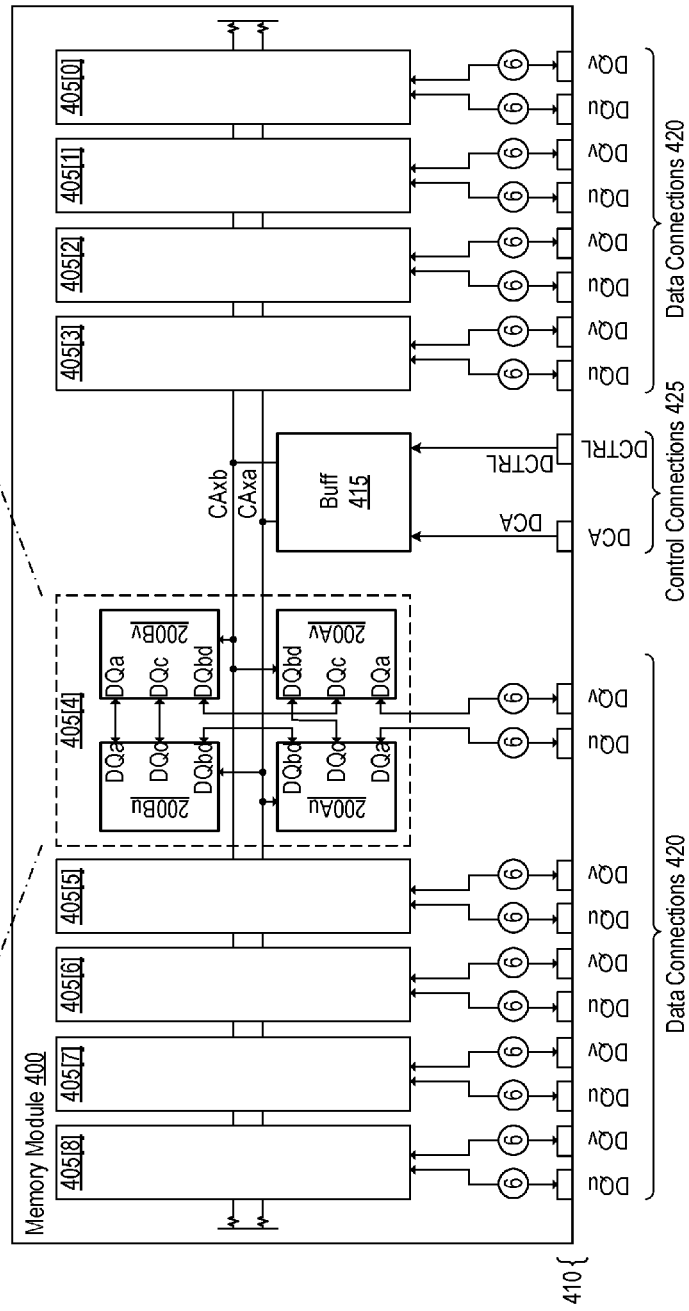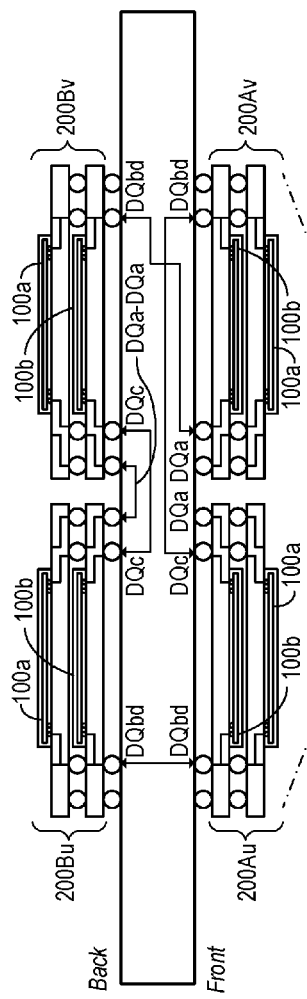
FIG. 4

FAULT TOLERANT MEMORY SYSTEMS AND COMPONENTS WITH INTERCONNECTED AND REDUNDANT DATA INTERFACES

BACKGROUND

Personal computers, workstations, and servers are general-purpose devices that can be programmed to automatically carry out arithmetic or logical operations. These devices include at least one processor, such as a central processing unit (CPU), and some form of memory system. The processor executes instructions and manipulates data stored in the memory.

Memory systems commonly include a memory controller that communicates with some number of memory modules via multi-wire physical connections called "channels." Each memory module commonly includes dynamic random access memory (DRAM) components mounted on a printed circuit board. Successive generations of DRAM components have benefited from steadily shrinking lithographic feature sizes. Storage capacity and signaling rates have improved as a result.

One metric of memory-system design that has not shown comparable improvement is the number of modules one can connect to a single channel. Adding a module to a channel increases the "load" on that channel, and thus degrades signaling integrity and limits signaling rates. The number of modules per memory channel has thus eroded with increased signaling rates. There is therefore a demand for increased module counts per channel.

Reliability is another important metric of memory-system design, and can be characterized in terms of mean time between failures. Adding complexity, such as additional modules per channel, increases the number of elements that might fail. Reliability can be improved by careful engineering, and modern computer systems are a testament to that care. Hardware faults remain a possibility, however. The most reliable systems detect and manage these and other problems. There nevertheless remains a need for ever more reliable systems.

BRIEF DESCRIPTION OF DRAWINGS

FIG. 1 depicts a DRAM component 100 that includes redundant and interconnected first and second component data interfaces 105a and 105b.

FIG. 2 depicts a DRAM package 200—also called a DRAM "stack"—comprised of two DRAM components 100a and 100b, each an instance of DRAM component 100 of FIG. 1.

FIG. 3A depicts a portion of a memory module 300 upon which is mounted an embodiment of DRAM package 200 of FIG. 2.

FIGS. 3B-3H depict respective modules 300B-300H, packaging alternatives that can provide connectivity to DRAM components that is functionally equivalent module 300 of FIG. 3A.

FIG. 4 depicts a memory module 400 in accordance with an embodiment that includes nine collections 405[8:0] of DRAM packages, each collection including a pair of frontside DRAM packages 200A and a pair of backside DRAM packages 200B.

DETAILED DESCRIPTION

Figure 5A:
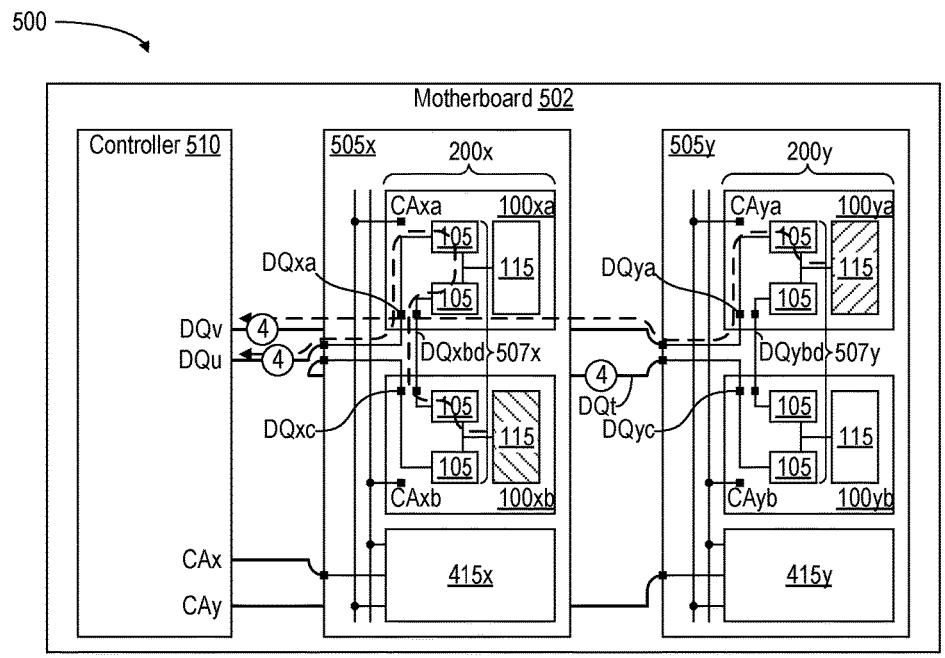
FIG. 5A depicts a memory system 500 in which two memory modules 505x and 505y, each configured in a ×36 mode, communicate ×72 data with a controller component 510.

FIG. 1 depicts a dual-port DRAM component 100 that includes redundant and interconnected first and second component data interfaces 105a and 105b serving respective data ports DQa and DQb. The redundant interfaces 105a and 105b facilitate memory interconnect topologies that accommodate considerably more DRAM components per memory channel than do traditional memory systems, and thus offer considerably more memory capacity per channel, without concomitant reductions in signaling speeds. Interfaces 105a and 105b also support flexible routing options that allow memory systems to route around defective data paths. Such alternative routing can reduce system speed performance, but maintains full capacity while allowing time for repair.

A multiplexer 110 allows either of data interfaces 105a and 105b to write data to a memory bank or banks 115 via a configurable delay element 120. Multiplexers 125, one in each of interfaces 105a and 105b, selectively convey read data from memory bank 115 to a respective data port DQa or DQb. Multiplexers 125 also allow component 100 to relay write and read data to and from other components 100, bypassing the local bank 115. Delay element 120 can impose selected read/write delays to align read and write transactions from and to disparate DRAM components 100.

Each of data ports DQa and DQb conveys nibbles of data, where a nibble is four bits. Each port includes six conductors, however, as two are used to communicate differential strobe signals DQSa± and DQSb± that serve as timing references for the accompanying data signals. A command/address interface CA conveys control signals (e.g. command, addresses, and chip-select signals) to CA logic 135, which manages memory transactions with banks 115 and controls the states of multiplexers 110 and 125.

DRAM component 100 includes one integrated circuit (IC) memory die in this example. In other embodiments, however, DRAM component 100 can include a "master die" with the type of circuitry shown here with additional DRAM dies stacked and interconnected with the master die using e.g. through-silicon vias (TSVs) for the die data and control interfaces. In one example, component 100 can include a stack of e.g. eight DRAM die that can be independently chip-selected by CA logic 130. Alternatively, all or some of the functionality provided by interfaces 105a/105b, multiplexer 110, delay element 120, and CA logic 130 can be provided by a separate buffer component.

FIG. 2 depicts a DRAM package 200—also called a DRAM "stack"—comprised of two DRAM components 100a and 100b, each an instance of DRAM component 100 of FIG. 1. The term "package" refers here both to a protective case and one or more IC dies or components enveloped within that case. Element names for components of DRAM components 100 end with lower-case letters where needed to distinguish between them. For example, interfaces CAa and CAb are coupled in parallel such that memory package 200 includes a command/address port CAab common to both components 100a/100b.

DRAM package 200 can include more or fewer components in other embodiments.

The first memory component 100a includes first and second component data ports DQa and DQb as described in connection with FIG. 1. The second memory component 100b includes similar third and fourth component data ports DQc and DQd. Component data ports DQb and DQd are interconnected to create a common package data port DQbd, and thus allow data to be conveyed directly between components 100a and 100b. Data ports DQa and DQc remain separate so that DRAM package 200 includes three nibble-wide package data ports DQa, DQc, and DQbd that are accessible via a package connector 205. As noted previously, each of these data ports conveys four bits of data (a nibble) and a differential strobe signal, for a total of six conductors. The strobe signals are omitted here for ease of illustration.

FIG. 3A depicts a portion of a memory module 300, a printed-circuit board (PCB) upon which is mounted an embodiment of DRAM package 200 of FIG. 2. Package 200 includes two sub-packages 302a and 302b with respective package substrates 305a and 305b wired to provide the connectivity illustrated in FIG. 2. Large connection balls 307 on the bottom of substrate 305a couple to pads on the top of substrate 305b. Similarly, the large connection balls on the bottom of substrate 305b serve as the package connector to couple to pads on a module substrate 310, e.g., a printed-circuit board. (Different types of package and sub-package connectors can be used, some of which are depicted in FIGS. 3B-3H.)

Both substrates 305a and 305b provide the same wiring patterns. A conductive trace 303 connects each (large) package connection ball 307 to a small connection ball (e.g. a C4 ball 309) on one of DRAM components 100a and 100b. On the right side of the package substrate, each connection ball 307 is coupled with the connection pad 311 directly above it. This forms a point-to-two-point (P-to-2P) connection topology for both data ports DQb and DQd. The same P-to-2P topology is used for CA ports CAa and CAb, but this detail is omitted here. The left sides of substrates 305a and 305b are different from the right; each connection ball is coupled with the connection pad above it and shifted one position to the right. These shifts form point-to-point (P-to-P) connection topologies for each of ports DQb and DQd.

FIGS. 3B-3H depict respective modules 300B-300H, packaging alternatives that can provide connectivity to DRAM components that is functionally equivalent module 300 of FIG. 3A. Modules 300B-300H can be customized to allow a mix of P-to-2p and P-to-P link topologies to be used by two DRAM components 100a and 100b. As detailed below, these topologies allow the second DQ interface on each DRAM component to be used to improve the capacity range and the performance of the system.

In FIG. 3H, component 100b supports center-stripe input/output pads 345 that connect to conductors within a module substrate 350 via wire bonds that extend through a window in the substrate. Component 100a is edge bonded to module substrate 350. Through-silicon vias (TSVs) 355 can be included to communicate signals between components 100a and 100b.

FIG. 4 depicts a memory module 400 in accordance with an embodiment that includes nine collections 405[8:0] of DRAM packages, each collection including a pair of front-side DRAM packages 200A and a pair of backside DRAM packages 200B. Each package 200A/200B includes two DRAM components 100a and 100b, so each collection 405[#] includes eight, and module 400 includes seventy-two. Examples of DRAM components 100a/100b and DRAM packages 200A/200B are detailed above in connection with respective FIGS. 1 and 2. The top of FIG. 4 depicts a side-view of one manner of mounting four packages, a pair of packages 200Au and 200Av on the front side of module 400 and a pair of packages 200Bu and 200Bv on the back. Each package 200 is as described in connection with FIGS. 2 and 3A. The front view of FIG. 4 illustrates both the package control and package data connections; the side view omits the control connections.

Module 400 includes a module connector 410 and an address buffer component 415. (Buffer component 415 is sometimes called a Registered or Registering Clock Driver, or RCD.) Module connector 410 provides external connectivity to a set of primary data connections 420 and primary control connections 425. In this context, "primary" connections are external to modules 400, and "secondary" connections are within.

Primary data connections 420 connect the package data interface of each of DRAM collections 405[8:0] to a corresponding pair of link groups DQu/DQv, each link group conveying four bits of data DQ and a differential strobe DQS±. Control connections 425 connect buffer component 415 to a primary command/address link group DCA and primary control link group DCTRL. As detailed below, buffer component 415 interprets command, address, and control signals on connections 425 to create and issue secondary command, address, and control signals to DRAM collections 405[8:0] via secondary link groups CAxa and CAxb. As used herein, a "link" is a conductor that provides a unidirectional or bidirectional communication between source and destination circuits, and a "link group" is a collection of links that communicates between source and destination circuits in parallel.

With reference to DRAM collection 405[4]—the others are identical—nibble DQu is coupled to input port DQa of the left front-side package 200Au, and nibble DQv is coupled to input port DQa of the right front-side package 200Av. The internal interconnectivity for each package 200 is as illustrated in FIGS. 1 and 2. All four packages 200 can be written to and read from via either of nibble-wide link groups DQu and DQv.

Module 400 supports different data widths. In a wide-data mode, each DRAM collection 405[8:0] communicates 8-bit-wide (×8, or "by eight") data as two nibbles DQv and DQu, for a total module width of 9×8=72 bits. In a narrow-data mode, each DRAM collection 405[8:0] communicates 4-bit-wide (×4) data as one of nibbles DQv and DQu, for a total module width of 9×4=36 bits. In either mode, data to and from packages 200Bu and 200Bv traverses respective packages 200Au and 200Av, which impose additional write and read delays. Delay elements 120 (FIG. 1) in packages 200Au and 200Av can insert delays that normalize the latencies for memory transactions to the different packages.

FIG. 5A depicts a memory system 500 in which a motherboard 502 supports two memory modules 505x and 505y, each configured in a ×36 mode, communicate ×72 data with a controller component 510. Motherboard 502, alternatively known as the mainboard or system board, is a printed-circuit board (PCB) commonly found in computers with expandable memory systems. Motherboard 502 supports and facilitates communication between electronic components and provides connections for peripheral devices.

Modules 505x and 505y are as detailed previously, each including a pair of DRAM components 100 interconnected physically and electrically into a single package 200 (e.g., like package 200 of FIG. 2). Each module 505 includes nine such pairs, but eight are omitted for ease of illustration. Modules 505x and 505y are similar or identical, with their respective and identical packages and components distinguished using a terminating "x" or "y".

DRAM components 100 in each DRAM package 200 includes data interfaces 105 that route data to and from memory banks 115, and between DRAM components 100. The four data interfaces 105 in each package 200x, collectively a package interface 507x, allow the respective module 505x to communicate data from either DRAM component 100xa or 100xb through either of two module data ports, one associated with each of ports DQxa and DQxc. Port DQxa is coupled to controller component 510 via a primary link group DQu, and port DQxc to module 505y via a primary link group DQt that is electrically isolated from controller component 510. A package data interface 507y likewise allows module 505y to communicate data from either DRAM component 100ya or 100yb through either of two module data ports associated with ports DQya and DQyc. Port DQya is coupled to controller component 510 via a primary link group DQv, and port DQyc to module 505x via a primary link group DQt. The routing flexibility provided by package data interfaces 507x and 507y supports point-to-point data connections with different numbers of modules, and also allows system 500 to reroute data around defective links and link groups.

Figure 5B:
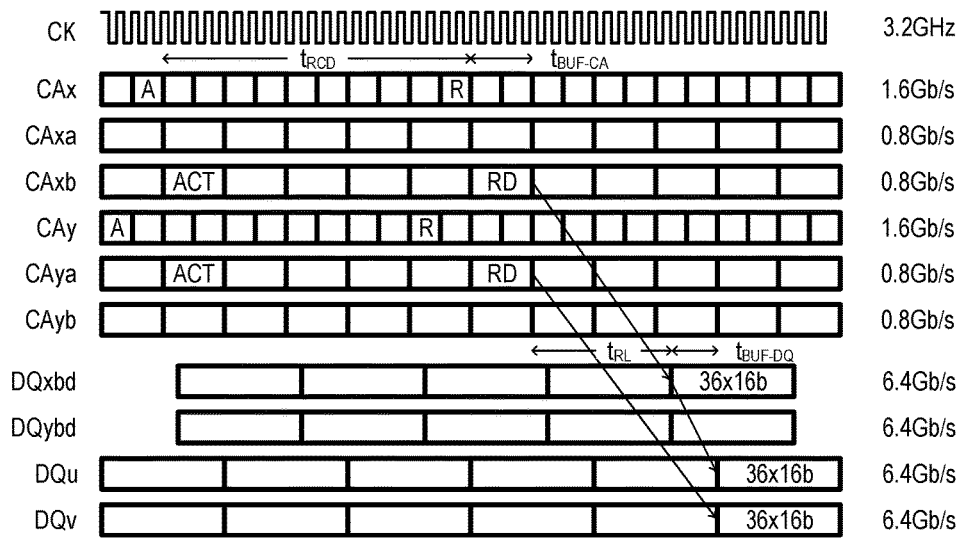
FIG. 5B is a timing diagram detailing a read transaction for system 500 of FIG. 5A. The "x" and "y" designations on modules 505 match the connections of the primary CA buses CAx and CAy.

FIG. 5B is a timing diagram detailing a read transaction for system 500 of FIG. 5A. The "x" and "y" designations on modules 505 match the connections of the primary CA buses CAx and CAy. Controller component 510 can be a dedicated memory controller, or can include support for additional functionality. A column at the right indicates the nominal signaling rate of the various buses for an embodiment in which the primary DQ signaling rate is 6.4 Gb/s. The relative signaling rate of the buses can scale up or down with the primary DQ rate. Each of the two read transactions includes an activate command (labeled "A" or "ACT"), a read command (labeled "R" or "RD"), and read data (labeled "36×16b"). The commands and data for each transaction are pipelined. This means that they occupy fixed timing positions with respect to the transactions, and that the transactions overlap other transactions. The timing intervals that are used are shorter than what might be considered typical at present. For example, the ACT to RD command spacing (tRCD) is shown as 6.25 ns, but would more commonly be about 12.5 ns. This compression of the timing scale is done for clarity, and does not affect the technical accuracy; the pipeline timing works equally well with a tRCD delay of 6.25 ns.

The tBUF-CA interval (0.93 ns) is the propagation delay needed by buffer components 415 to retransmit the information on the primary CA links CAx and CAy to the secondary CA links CAxa/CAxb and CAya/CAyb. The tRL interval (3.125 ns) is the column read delay between the RD command and the read data needed by the DRAM. The tBUF-DQ (0.93 ns) interval is the propagation delay needed by the DRAM on module 505x to retransmit the information on the secondary links DQxa and DQxc links to primary link group DQu. This is because DRAM component 100xb lacks a direct connection to controller component 510.

The access on module 505y has a configurable delay (tBUF-DQ) inserted in its read access so that the read data is returned to the controller on primary link groups DQu and DQv at approximately the same time. This incremental delay makes it easier for the controller to manage the memory pipeline. The diagram for write transactions would be similar, but with different fixed timing positions of commands and data.

The transaction granularity that is shown is 72 bytes, or 72 bits with an eight-bit burst length. There are enough command slots to allow each time slot of primary links DQu and DQv to be filled with data. Each transaction performs a random row activation and column access on each 72 bytes ("36×16b"). Other transaction granularities are possible. Note that there are 576 bits forming each 72-byte transfer block. Each transfer block communicates 64 bytes of data with an extra eight bytes to allow for the transfer and storage of a checksum for an EDC (error detection and correction) code.

If there are bank conflicts in the transaction stream, and if the transaction stream switches between read and write operations, then data slots are skipped. This form of bandwidth inefficiency is typical of memory systems. No additional resource conflicts are introduced by the modifications that have been made to this improved memory system.

The "x" and "y" transactions begin with an activation command "A" on the CAx and CAx buses. These buses have a point-to-point topology and a signaling rate of 1.6 GB/s (one-quarter the signaling rate of the point-to-point DQ buses).

Buffer components 415x and 415y each receives the primary CA bus and retransmits the information on secondary buses CAxa/CAxb and CAya/DQyb. The secondary CA buses operate at 0.8 Gb/s, half the speed of the primary CA buses and ⅛th the speed of the primary DQ buses. This is because the module CA buses have a multi-drop topology; each of the module CA buses connects to half of the DRAM components on the module. The "x" and "y" transactions continue with a read command "R" on the CAx and CAy buses, which is retransmitted on secondary buses CAxb and CAya.

The two read transactions access two of the four dual-port DRAM components, components 100ya and 100xb in this example. The "x" transaction accesses component 100xb, which means that the read data will be driven onto secondary links DQxbd to the upper DRAM component 100xa and then conveyed to controller component 510 on primary links DQu. The "y" transaction accesses component 100ya, which drives the read data onto primary links DQv. An incremental delay is added to the "y" transaction so the read data on primary links DQu and DQv arrive at controller component 510 at approximately the same time. In this example, the delay to retransmit from secondary links DQxbd to primary links DQu is approximately three clock cycles (about one nanosecond). This example provides one cycle for serialization latency (two data bits per clock cycle) plus two additional clock cycles for clock skew between the two DRAM components (±1 clock cycle). The other DRAM components in the four DRAM component set would be accessed with a high order address bit set differently in the CAx and CAy commands. Primary link group DQt is not used; the interface circuitry on the DRAM components connected to this bus will typically be disabled by e.g. a control register field.

Figure 5C:
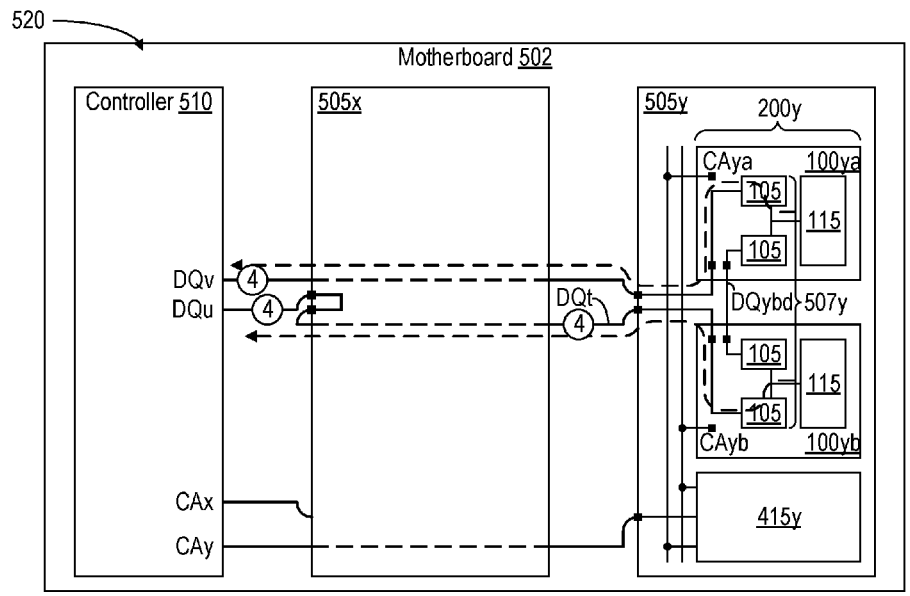
FIG. 5C depicts a memory system 520 similar to system 500 of FIGS. 5A and 5B but with one module 505y and a continuity module 525x.

FIG. 5C depicts a memory system 520 similar to system 500 of FIGS. 5A and 5B but with one module 505y and a continuity module 525x. Continuity module 525x connects link group DQu to link group DQt; each of the four DQ links and the two DQS links is connected with a controlled impedance wire that matches (approximately) the impedance of the motherboard wires of the data link groups. The CAx bus is not connected to anything on the continuity module.

Figure 5D:
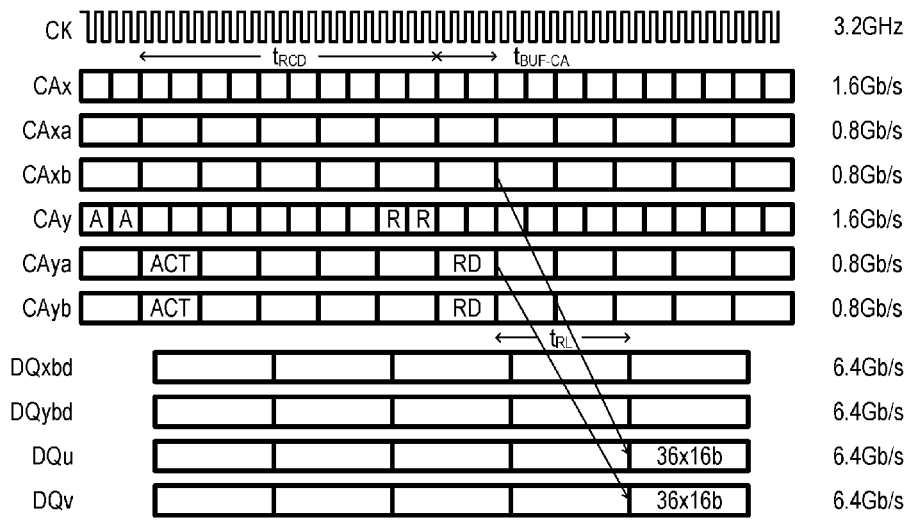
FIG. 5D is a timing diagram detailing a read transaction for system 500 of FIG. 5C.

FIG. 5D is a timing diagram detailing a read transaction for system 500 of FIG. 5C. As with the example of FIG. 5B, this diagram indicates the nominal signaling rate of the various buses, assuming that the primary DQ signaling rate is 6.4 Gb/s. Each of two read transactions includes an activate command (labeled "A" or "ACT"), a read command (labeled "R" or "RD"), and read data (labeled "36×16b"). The commands and data for each transaction are pipelined. This means that they occupy fixed timing positions with respect to the transaction, and it also means that the transactions overlap other transactions.

The fixed timing positions may be shifted slightly from the positions in other configurations. This shifting will not cause a scheduling problem for controller component 510 because these configurations are static; e.g. the configuration is detected at system initialization, and after the appropriate control register field(s) are set, the configuration will not be changed.

The timing intervals that are used are shorter than what are present in a typical system. For example, the ACT to RD command spacing (tRCD) is shown as 6.25 ns, but could be e.g. about 12.5 ns in other embodiments. This compression of the timing scale is done for clarity, and does not affect the technical accuracy; the pipeline timing works equally well with a tRCD delay of 6.25 ns.

The tBUF-CA interval (0.93 ns) is the propagation delay needed by the RCD buffer component to retransmit the information on the primary CA links to the secondary CA links. The tRL interval (3.125 ns) is the column read delay between the RD command and the read data needed by the DRAM. The tBUF-DQ (0.93 ns) interval does not appear in this example because the DRAM components have a direct primary connection to the controller. In other one-module configurations this propagation delay could be present if a DRAM component needs to transfer its data through another DRAM component on module 505y. The diagram for write transactions would be similar, but with different fixed timing positions of commands and data. Each transaction performs a random row activation and column access on each 64 bytes ("36×16b"). Other transaction granularities are possible.

There are 576 bits forming each 64 byte transfer block. The extra 64 bits allow for the transfer and storage of a checksum for an EDC (error detection and correction) code. If there are bank conflicts in the transaction stream, and if the transaction stream switches between read and write operations, then data slots will need to be skipped. This form of bandwidth inefficiency is common in memory systems. No additional resource conflicts are introduced by the modifications that have been made to this improved memory system.

Returning to FIG. 5D, the "x" and "y" transactions begin with an activation command "A" on the CAy bus. The CAx bus is not used in this configuration. These buses have a point-to-point topology and a signaling rate of 1.6 GB/s (one-quarter the signaling rate of the point-to-point DQ buses). RCD buffer component 415y receives the primary CAy bus and retransmits the information on the CAyb and CAya module buses. The CA module buses operate at 0.8 Gb/s, half the speed of the primary CA buses and ⅛th the speed of the primary DQ buses. This is because the module CA buses have a multi-drop topology; each of the module CA buses connects to half of the DRAM components on the module. The "ya" and "yb" transactions continue with a read command "R" on the CAy bus. This is retransmitted on the CAyb and CAya module buses. The two read transactions have accessed the two DRAM components 100ya and 100ya that respectively connect to the nibble-wide primary link groups DQv and DQu. Where each package contains a stack of DRAM die, each transaction accesses the memory in one die in each component.

The "yb" transaction accesses the lower DRAM component 100yb in this example. (DRAM components 100 with multiple DRAM dies may be referred to as a DRAM "stack"). This means that the read data will be driven onto primary links DQt, through continuity module 525x, and then to the controller on primary links DQu. The incremental propagation time of the "yb" read data through the continuity module is small enough that it can be absorbed in the clock skew management circuitry, so the read data on link groups DQu and DQv arrive at the controller at approximately the same time.

Figure 5E:
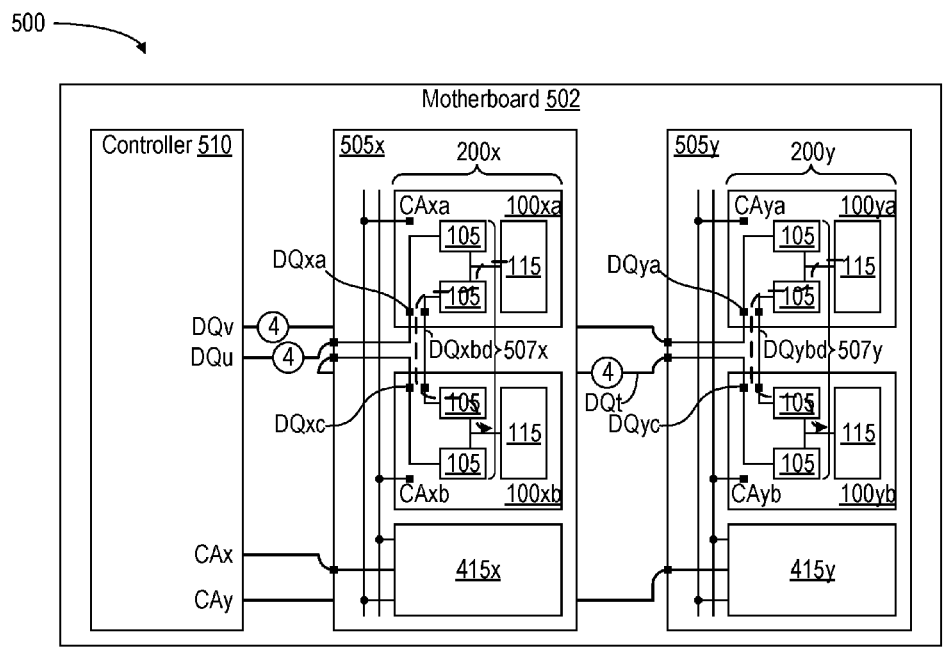
FIG. 5E depicts system 500 of FIG. 5A but illustrates how the interface logic can accommodate direct transfers between two DRAM components on the same module.
Figure 5F:
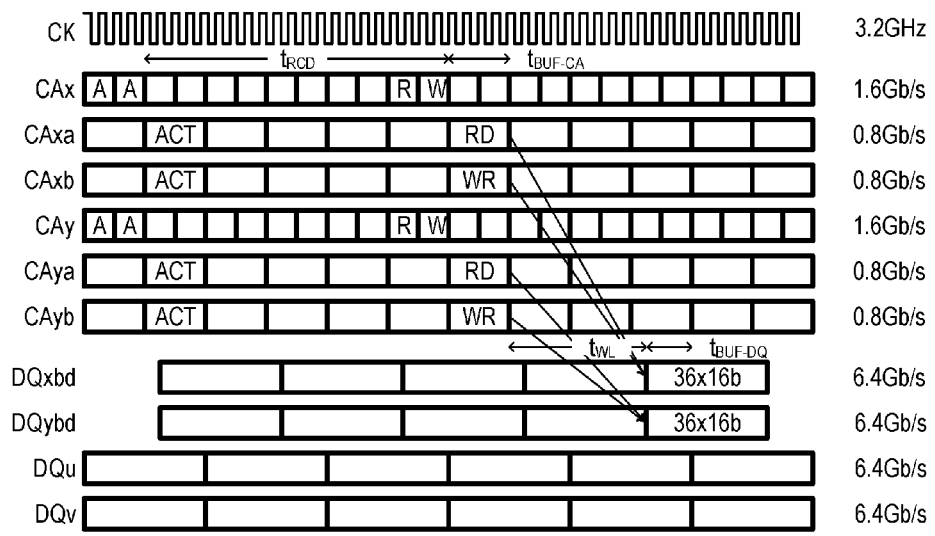
FIG. 5F shows the waveforms of the various CA and DQ links, and also indicates the nominal signaling rate of those buses in accordance with one embodiment.

FIG. 5E depicts system 500 of FIG. 5A but illustrates how the interface logic can accommodate direct transfers between two DRAM components on the same module. FIG. 5F shows the waveforms of the various CA and DQ links, and also indicates the nominal signaling rate of those buses in accordance with one embodiment. Each direct transfer operation involves a read transaction in one DRAM component 100 and a write transaction in another component 100 on the same module 505. Transactions can be carried out simultaneously on each module, so that four transactions take place, twice as many as in the read transaction examples of FIGS. 5A-5D.

Each of the two read transactions includes an activate command (labeled "A" or "ACT"), a read command (labeled "R" or "RD"), and read data (labeled "36×16b"). Each of the two write transactions includes an activate command (labeled "A" or "ACT"), a write command (labeled "W" or "WR"), and write data (labeled "36×16b"). In this case, the write data results from the read transaction. The timing of the write transaction (tWL) is configured to approximately match the read transaction (tRL) with respect to the interval from the column command to the column date. The data is transferred on the shared DQ bus between the DRAM components (link groups DQyab and DQxab in this case).

The timing may be described as "approximately" matching to recognize that each DRAM component 100 will accommodate a small amount of variability in the timing of its interface. This is because the position of the receive data and transmit data will drift over a small range during system operation. Interfaces 105 accommodate this dynamic drift, with the result that any drift (within the allowed range) will not affect the operation of the memory system.

When the command-to-data interval for a write operation matches a read operation, controller component 510 accounts for the bank usage when a transfer transaction or a write transaction to a DRAM component 100 is followed by a read transaction to the same DRAM component. This resource management is a common function of memory controllers.

The commands and data for each transaction are pipelined. This means that they occupy fixed timing positions with respect to the transaction, and it also means that the transactions overlap other transactions. The timing intervals are shorter than what are present in a typical system. For example, the ACT to RD command spacing (tRCD) is shown as 6.25 ns, but would be about 12.5 ns for a real DRAM component. This compression of the timing scale is done for clarity, and does not affect the technical accuracy; the pipeline timing works equally well with a tRCD delay of 6.25 ns.

The tBUF-CA interval (0.93 ns) is the propagation delay needed by the RCD buffer component 415 to retransmit the information on the primary CA links to the secondary CA links. The tRL interval (3.125 ns) is the column read delay between the RD command and the read data needed by the DRAM component 100. The tBUF-DQ (0.93 ns) interval does not appear in this example because each DRAM read package has a direct connection to the DRAM write component destination. In other configurations this propagation delay could be present if a DRAM read component transfers data through another DRAM component on the module to the DRAM write component destination.

The transaction granularity that is shown is 64 bytes; that is, there are enough command slots to allow each slot of primary link groups DQu and DQv to be filled with data. Each transaction performs a random row activation and column access on each 64 bytes ("36×16b"). Other transaction granularities are possible. Each byte is assumed to be 9b in size in this example. The ninth bit accounts for the checksum of an EDC (error detection and correction) code.

Returning to the waveform diagram, it can be seen that the "x" and "y" transactions begin with an activation command "A" on the CAx and CAy buses. These buses have a point-to-point topology and a signaling rate of 1.6 GB/s (one-quarter the signaling rate of the point-to-point DQ buses). Each RCD buffer components 415x and 415y receives the primary CA bus and retransmits the information on the CAxa, CAxb, CAya, and CAyb module buses. All four of the CA module buses are used for the transfer transaction.

The CA module buses operate at 0.8 Gb/s, half the speed of the primary CA buses and ⅛th the speed of the primary DQ buses. This is because the module CA buses have a multi-drop topology; each of the four module CA buses connects to about ¼ of the DRAM components on the module. The "x" and "y" transactions continue with two read commands "R" and two write commands "W" on the CAx and CAy buses. This is retransmitted as two read commands "RD" and two write commands "WR" on the CAxa, CAxb, Cya, and CAyb buses. The two read transactions have accessed two DRAM components 100xa and 100ya, and the two write transactions have accessed the other two DRAM components 100xb and 100yb. The "x" read transaction accesses the upper DRAM component 100xa. The read data will be driven onto secondary links DQxab to the lower DRAM component 100xb, to be written to the selected DRAM die. Likewise, the "y" read transaction accesses the upper DRAM component 100ya. The read data will be driven onto the DQyab primary links to the lower DRAM component 100yb to be written to the selected DRAM die. A different DRAM component 100 would be accessed with a high-order address bit set differently in the CAx and CAy commands. The primary data interfaces associated with link groups DQu, DQv, and DQt are not used for these transfers; the interfaces 105 connected to these link groups can be disabled by e.g. a control register field during such transfer operations.

Figure 5G:
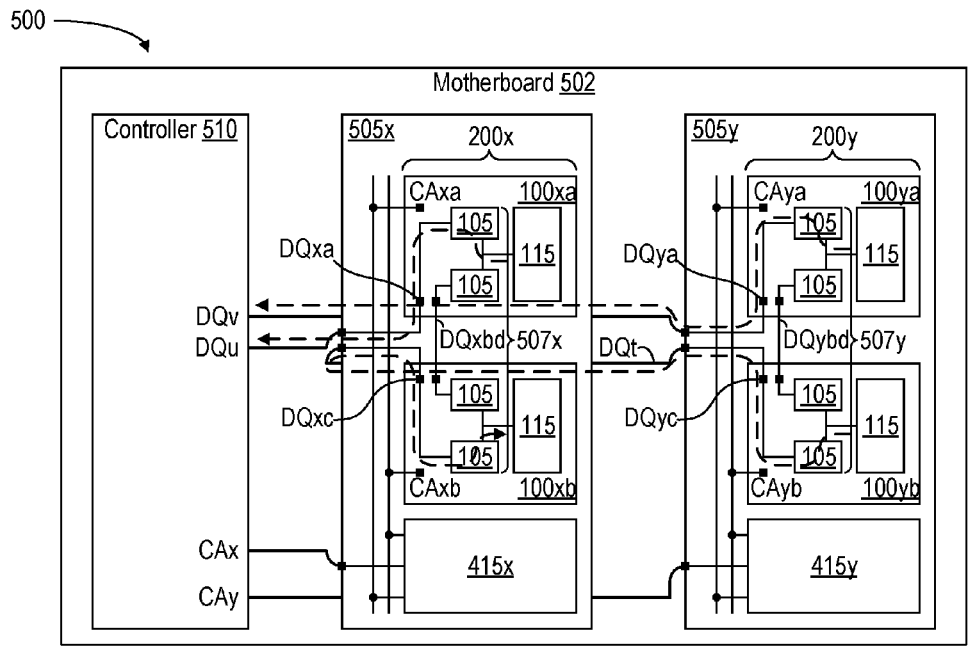
FIG. 5G depicts system 500 of FIG. 5A but illustrates how the interface logic can accommodate direct data transfers between DRAM components on different modules.
Figure 5H:
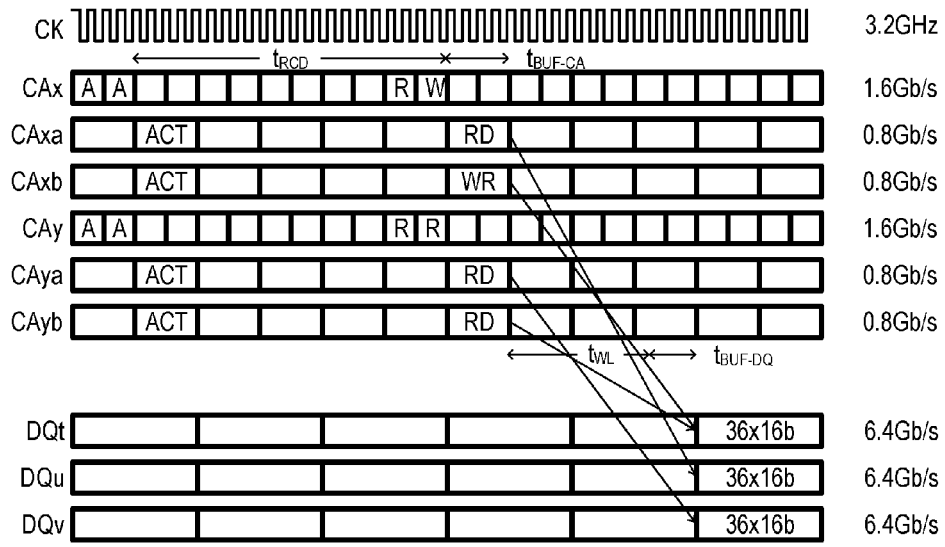
FIG. 5H shows the waveforms of the various CA and DQ buses, and also indicates the nominal signaling rate of those buses in accordance with one embodiment.

FIG. 5G depicts system 500 of FIG. 5A but illustrates how the interface logic can accommodate direct data transfers between DRAM components on different modules. FIG. 5H shows the waveforms of the various CA and DQ buses, and also indicates the nominal signaling rate of those buses in accordance with one embodiment.

An illustrated transfer operation involves a read transaction in DRAM component 100yb of module 505y and a write transaction in DRAM component 100xb of module 505x. These transactions can be carried out concurrently with two additional read transactions, so that four transactions take place. Each of the three read transactions includes an activate command (labeled "A" or "ACT"), a read command (labeled "R" or "RD"), and read data (labeled "36×16b"). The single write transaction includes an activate command (labeled "A" or "ACT"), a write command (labeled "W" or "WR"), and write data (labeled "36×16b").

In this case, the write data results from one of the read transactions. The timing of the write transaction is configured to approximately match the read transaction with respect to the interval from the column command to the column date. The data is transferred on the shared link group DQt between the two modules.

When the command-to-data interval for a write operation matches a read operation, controller component 510 accounts for the bank usage when a transfer transaction or a write transaction to a DRAM component 100 is followed by a read transaction to the same component. This resource management is a common function performed by memory controllers. The commands and data for each transaction can be pipelined. As in prior examples, the depicted timing intervals are relatively short.

The tBUF-CA interval (0.93 ns) is the propagation delay needed by the RCD buffer component to retransmit the information on the primary CA links to the secondary CA links. The tRL interval (3.125 ns) is the column read delay between the RD command and the read data needed by the DRAM. The tBUF-DQ (0.93 ns) interval does not appear in this example because each DRAM component has a direct connection its destination (to controller component 510 or to DRAM write component). In other configurations this propagation delay could be present if a DRAM read component needs to transfer its data through another DRAM component on the module to the DRAM write component destination.

The transaction granularity that is shown is 64 bytes; that is, there are enough command slots to allow each of the primary DQu and DQv time slots to be filled with data. Each transaction performs a random row activation and column access on each 64 bytes ("36×16b"). Other transaction granularities are possible.

There are 576 bits forming each 64 byte transfer block, which allow an extra eight bytes for the transfer and storage of a checksum for an EDC (error detection and correction) code. The "x" and "y" transactions begin with a activation command "A" on the CAx and CAy buses. These buses have a point-to-point topology and a signaling rate of 1.6 GB/s (one-quarter the signaling rate of the point-to-point DQ buses). Address buffer components 415x and 415y each receives the same primary CA information and retransmits the information on the CAxa, CAxb, CAya, and CAyb module buses. Alternatively, the primary CA information can be different to activate and address difference locations on modules 505x and 505y. All four of the CA module buses will be used for the transfer transaction.

The CA module buses operate at 0.8 Gb/s, half the speed of the primary CA buses and ⅛th the speed of the primary DQ buses. This is because the module CA buses have a multi-drop topology; each of the module CA buses connects to half of the DRAM components on the module. The "x" and "y" transactions continue with three read commands "R" and one write command "W" on the CAx and CAy buses. This is retransmitted as three read commands "RD" and one write command "WR" on the CAxa, CAxb, CAya, and CAyb buses. The three read transactions have accessed three of the four DRAM components, and the write transaction has accessed the other DRAM component in this example.

The figure shows one of the nine sets of DRAM components 100a/100b on each module. The four transactions have each accessed one of the DRAM components in each set. In the case of an access to the primary DRAM component, some additional delay will be added to the access time so that the read data is transmitted on the primary DQ in the same relative time slot. This incremental delay makes it easier for the controller to manage the memory pipeline. The DQxbd and DQybd link groups are not required in this example; the involved interface 105 can be disabled by the command decode logic in the primary DRAM component of each package.

Fault Tolerance

Figure 5I:
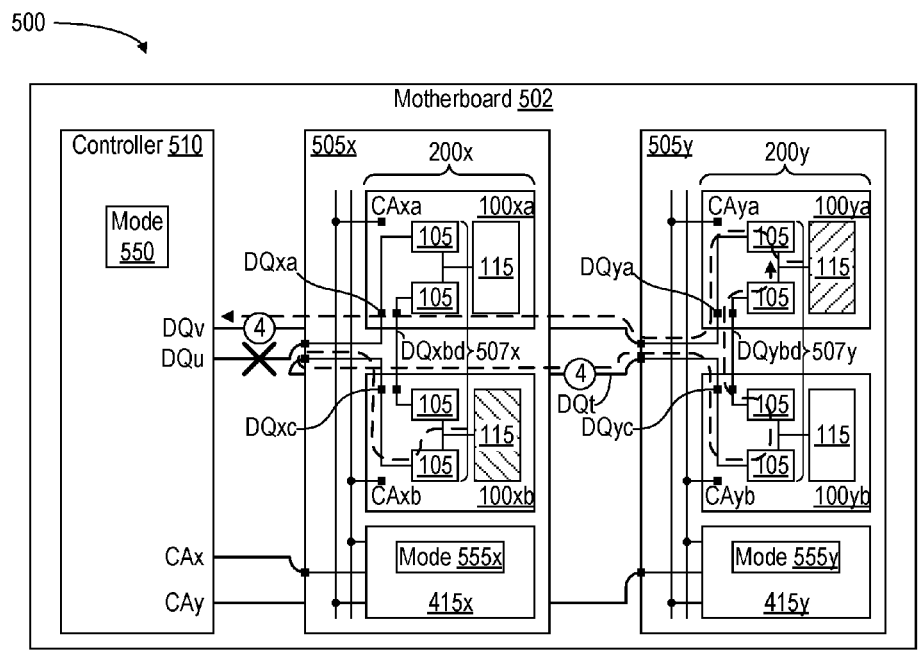
FIG. 5I depicts system 500 of FIG. 5A but illustrates how interfaces 105 on components 100 provide routing options that allow modules 505 to route read and write data around defective data paths DQu.

FIG. 5I depicts system 500 of FIG. 5A but illustrates how interfaces 105 on components 100 provide routing options that allow modules 505 to route read and write data around defective data paths. In this illustration, primary data link group DQu between controller component 510 and module 505x is defective (denoted by an "X" through the faulty link group). For example, one or more of the constituent data or strobe links can be compromised by an open or short circuit. Such problems can result from e.g. manufacturing defects or corrosion. To address this problem, system 500 supports a DQu-fault mode in which both modules 505x and 505y communicate via primary link group DQv.

Module 505y is coupled directly to the functional link group DQv, and in the DQu-fault mode communicates data as in the normal mode. Module 505x reroutes data around the faulty link group DQu to the functional data link group DQv using link group DQt and module 505y. Latency counters and configuration data (not shown) in controller component 510 are updated to reflect the fact that the missing data connection slows the communication of data, and to configure controller component 510 to steer and assemble the data signals as needed to comply with e.g. error correction supported in both modes. These changes can be done in firmware or autonomously by the controller when a fault is detected. Controller component 510 can issue an alert signal identifying the nature and location of the problem. System 500 thus supports alternative routing that maintains full capacity, albeit at reduced bandwidth, to allow time for repair.

Controller component 510 includes a mode register 550 that stores a value indicative of the fault or faults. Each buffer component 415x and 415y likewise includes a respective register 555x and 555y that controller component 510 loads e.g. during initialization to configure modules 505x and 505y to respond appropriately to read and write commands. The values in registers 550, 555x, and 555y can route data around all nine of link groups DQu, or can separately control the link groups associated with each link-group pair. Support for the latter case is more complex, but affords more rerouting flexibility (e.g., one link-group pair can use link group DQu and another link group DQv).

Mode registers 555x and 555y control respective buffer components 415x and 415y to direct data through respective package data interfaces 507x and 507y. In normal mode, package data interfaces 507x and 507y communicate with controller component 510 via respective data ports DQxa and DQya as noted in connection with FIG. 5A. In a DQu-fault mode, package data interface 507x in module 505x disables the data port DQxa connected to the faulty primary link group DQu, and thereafter communicates via second data port DQxc and primary link group DQt. Data from module 505x is thus communicated with controller component 510 via data interface 507y of module 505y and the functional primary link group DQv.

Figure 5J:
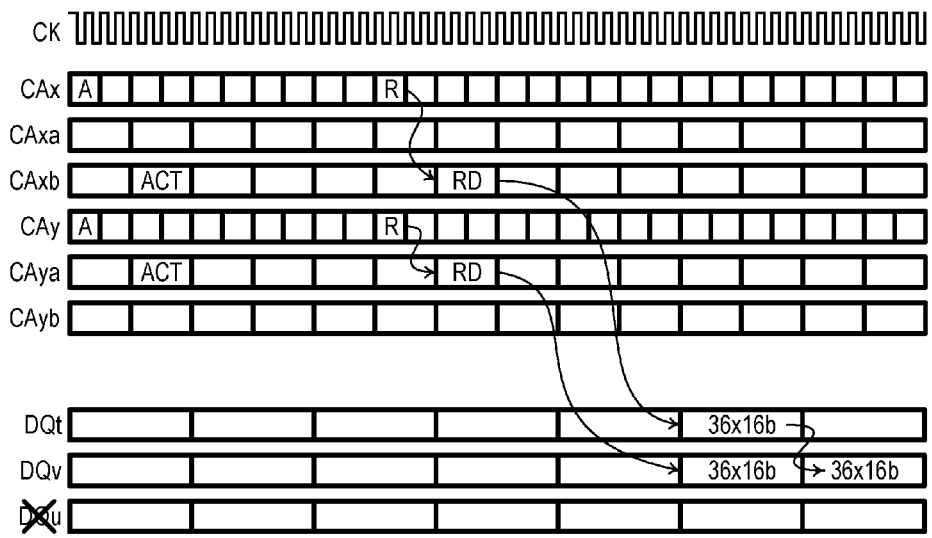
FIG. 5J is a timing diagram detailing a read transaction for system 500 of FIG. 5I.

FIG. 5J is a timing diagram detailing a read transaction for system 500 of FIG. 5I. The signaling rates are as noted previously in connection with FIG. 5B. Controller component 510 is assumed to have identified the defective link group DQu and loaded registers 550, 555x, and 555y accordingly. Controller component 510 can employ any of a number of commonly known techniques for error detection.

Controller component 510 issues activation commands "A" on the CAx and CAy command buses to initiate a transaction that involves both modules 505x and 505y. Buffer components 415x and 415y receive activate commands on respective primary busses CAx and CAy and retransmit the information on the CAxa/CAxb and CAya/CAyb module buses. The example being a read transaction, the "x" and "y" transactions includes an activate command "A" followed by a read command "R" on each of the secondary CAx and CAy buses. The two read transactions access two of the four DRAM components, components 100ya and 100xb, in this example. The "y" transaction accesses component 100ya, which drives read data onto the DQv primary links via port DQya. The "x" transaction accesses component 100xb, the read data from which is driven onto data port DQxc. To bypass defective link group DQu, the read data from port DQxc is communicated to port DQyc of module 505y via primary link group DQt. DRAM components 100*yb* and 100*ya* then convey the read data to controller component 510 via link group DQv.

The read data from DRAM component 100*xb* follows the read data from DRAM component 100*ya* in the next time slot for link group DQv. Each transaction performs a row activation and column access to deliver 72 bytes (36×16b) of data. At the direction of buffer component 415*y*, module 505*y* adds an incremental delay to the data from module 505*x* so the respective sets of read data from modules 505*y* and 505*x* arrive at controller component 510 in successive time slots.

Figure 5K:
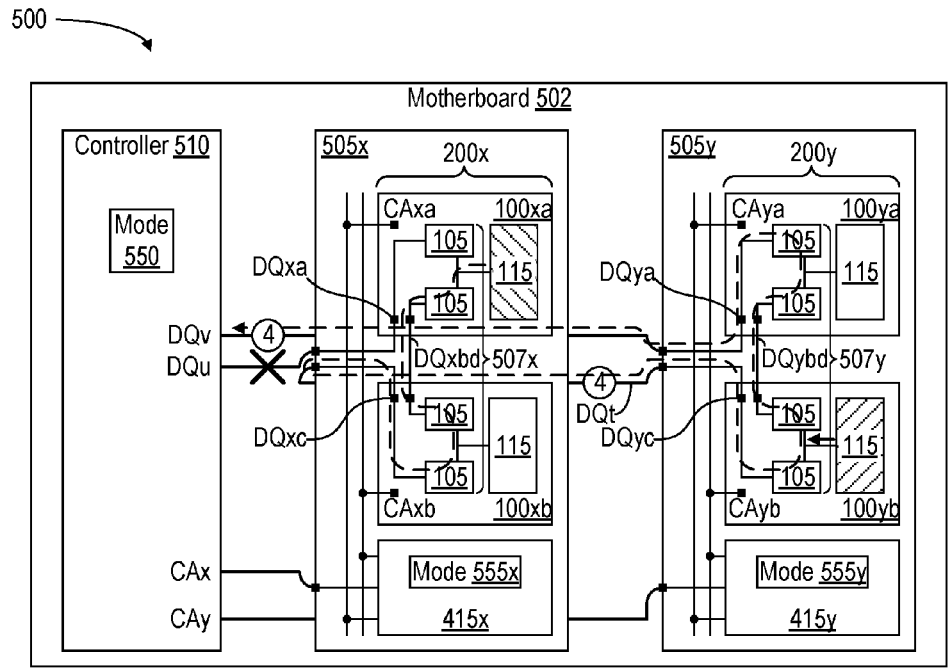
FIG. 5K is similar to FIG. 5I, illustrating how data can be routed to and from DRAM components 100xa and 100yb via primary link group DQv in a DQu-fault mode.

FIG. 5K is similar to FIG. 5I, illustrating how data can be routed to and from DRAM components 100*xa* and 100*yb* via primary link group DQv in the DQu-fault mode. Package data interface 507*x* routes data to and from DRAM component 100*xa* via DRAM component 100*xb*, the latter of which communicates with controller component 510 as detailed above in connection with FIGS. 5I and 5J. Package data interface 507*y* routes data to and from DRAM component 100*yb* via DRAM component 100*ya*, the latter of which communicates with controller component 510 via primary data link group DQv. Relative to the example of FIGS. 5I and 5J, the data communicated in this example traverse one additional DRAM component 100, and thus experience additional read and write latency to be accounted for by controller component 505, address-buffer components 415, or both.

Figure 5L:
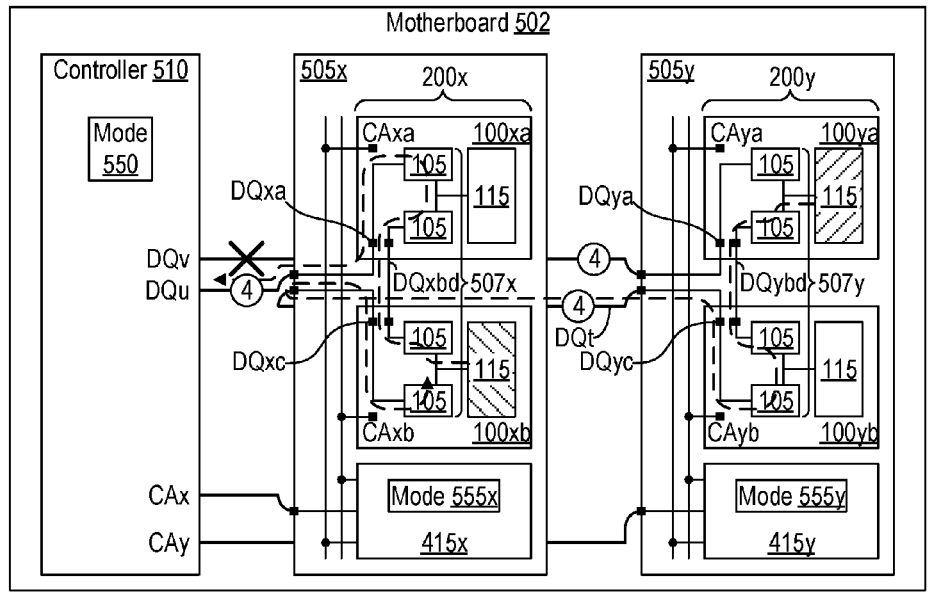
FIGS. 5L and 5M are similar to FIGS. 5I and 5J, but illustrate how interfaces 105 can route read and write data around a faulty primary link group DQv in a DQv-fault mode.
Figure 5M:
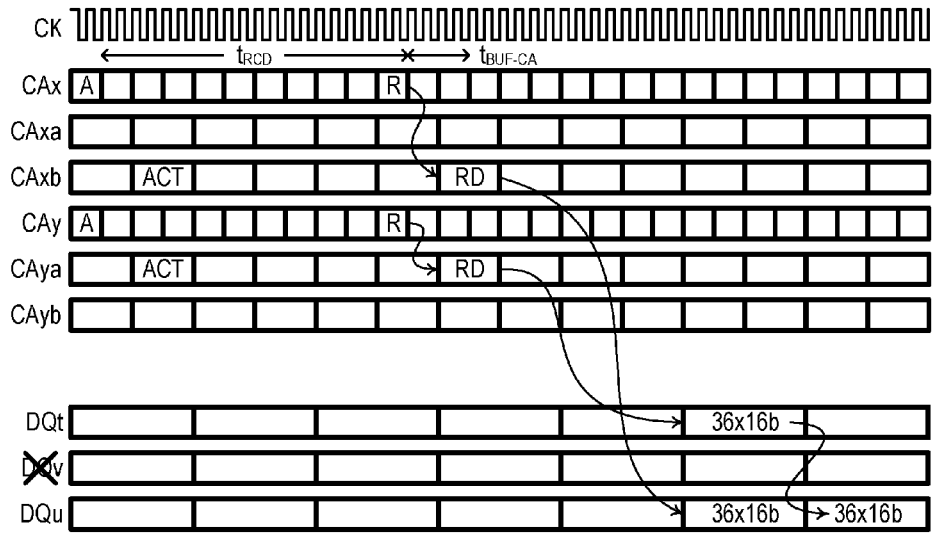

FIGS. 5L and 5M are similar to FIGS. 5I and 5J, but illustrate how interfaces 105 can route read and write data around a faulty primary link group DQv in a second fault mode, the DQv-fault mode, which modules 505*x* and 505*y* enter when designated values are loaded into respective registers 555*x* and 555*y*. Other than the illustrated connectivity, the operation of system 500 is as detailed above in connection with FIGS. 5I and 5J. In summary, the first package data interface 507*x* selectively communicates between first data port DQxa and second data port DQxc at the direction of buffer component 415*x* to relay data between module 505*y* and controller component 510; the second package data interface 507*y* disables third data port DQya—the one connected to the faulty primary link group DQv—and communicates instead via fourth data port DQyc.

Figure 5N:
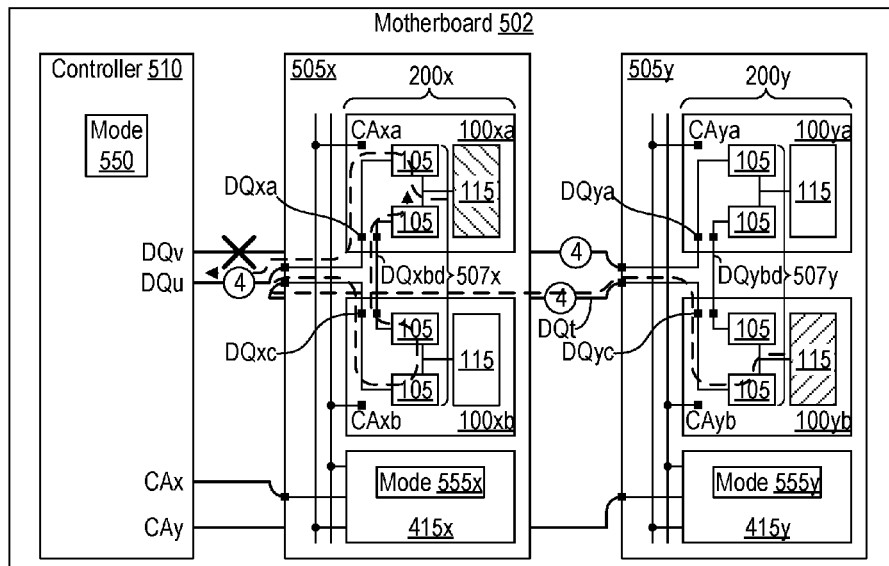
FIG. 5N illustrates how data can be routed to and from DRAM components 100xa and 100yb via primary link group DQu in the DQv-fault mode.

FIG. 5N is similar to FIG. 5L, illustrating how data can be routed to and from DRAM components 100*xa* and 100*yb* via primary link group DQu in the DQv-fault mode. As in prior examples, heavy, dashed lines illustrate paths for read data.

Figure 6A:
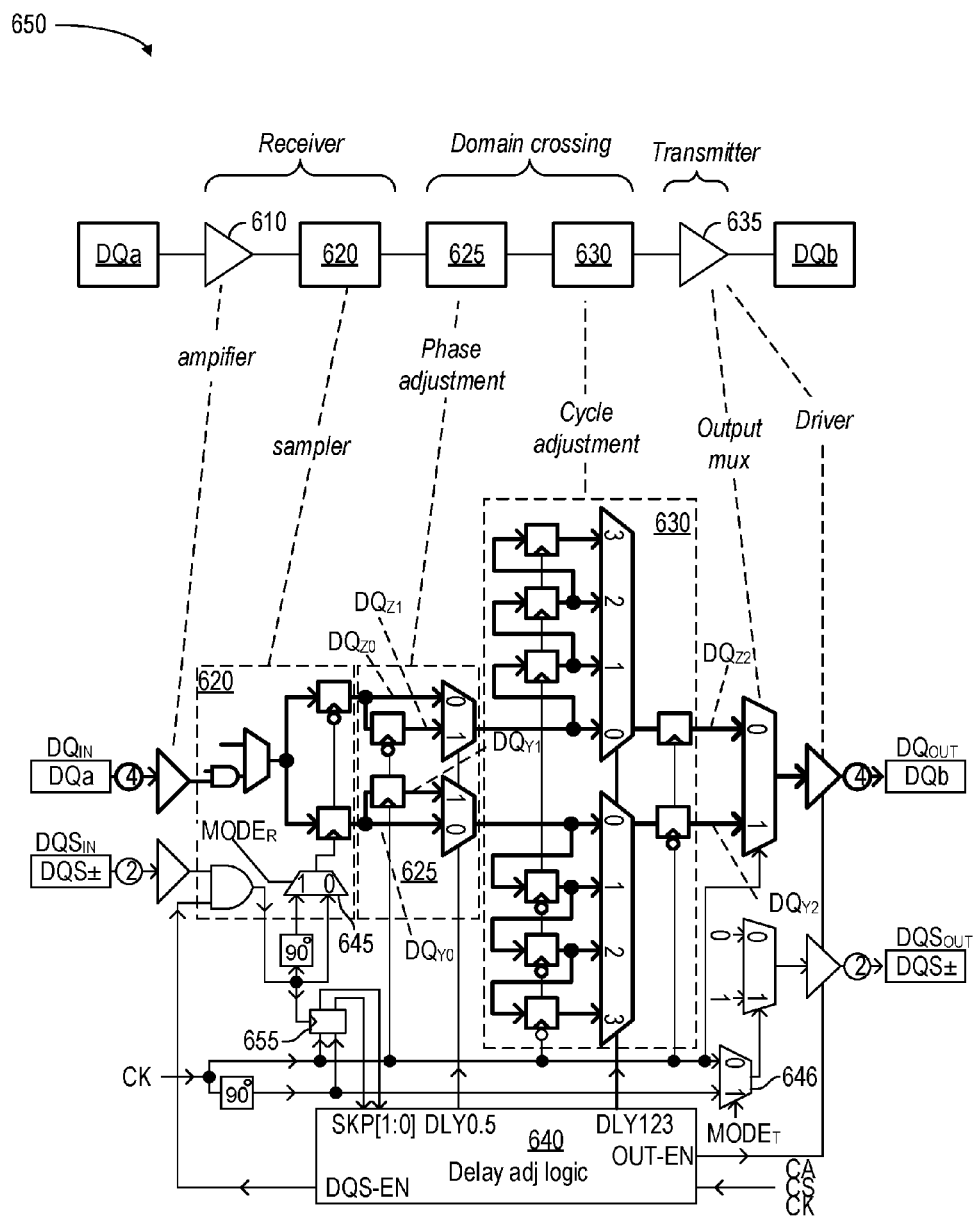
FIG. 6A is a diagram 650 depicting elements of interfaces 105a and 105b that establish a communication path from port DQa to port DQb.

FIG. 6A is a diagram 650 depicting elements of interfaces 105*a* and 105*b* that establish a communication path from port DQa to port DQb. Though omitted here for brevity, a similar path extends in the opposite direction. Ports DQa/DQb are alternatively labeled $DQ_{IN}$ and $DQ_{OUT}$ to reflect the direction of signal flow for this example. Strobe ports DQS± on either side are similarly labeled $DQS_{IN}$ and $DQS_{OUT}$.

Much of the circuitry of diagram 650 operates in a clock domain timed to a clock signal CK that accompanies the CA signals. The receiver portion, which includes amplifier 610 and sampler 620, operates in the domain of the received strobe $DQS_{IN}$. A pair of multiplexers 645 and 646 with selector inputs $MODE_R$ and $MODE_T$ driven from e.g. control register fields selectively introduce a ninety-degree phase shift to adjust the phase relationships between the data and strobe signals for both receive and transmit blocks. Delay adjustment logic 640 performs the domain-crossing function between the domain of the receiver and the one timed to clock signal CK. Logic 640 generates a signal DQS-EN that establishes an enable window for the strobe signal in the CK clock domain upon receipt of a read or write command.

A sampler 655 samples the undelayed and 90° delayed clock signal CK by the strobe signal $DQS_{IN}$, and the resulting values SKP[1:0] determine how to adjust the DLY0.5 phase value and DLY123 cycle value from their initial value. This determination is performed e.g. on every data transfer to allow 0 to 4 TCK of misalignment between signals $DQS_{IN}$ and CK to be automatically compensated. A pair of multiplexers in transmitter 635 selectively insert a zero or ninety degree phase shift in the strobe signal DQS on the transmit side. An output-enable signal OUT-EN from logic 640 produces an enable window for the output driver of transmitter 635 upon receipt of a read or write command.

Figure 6B:
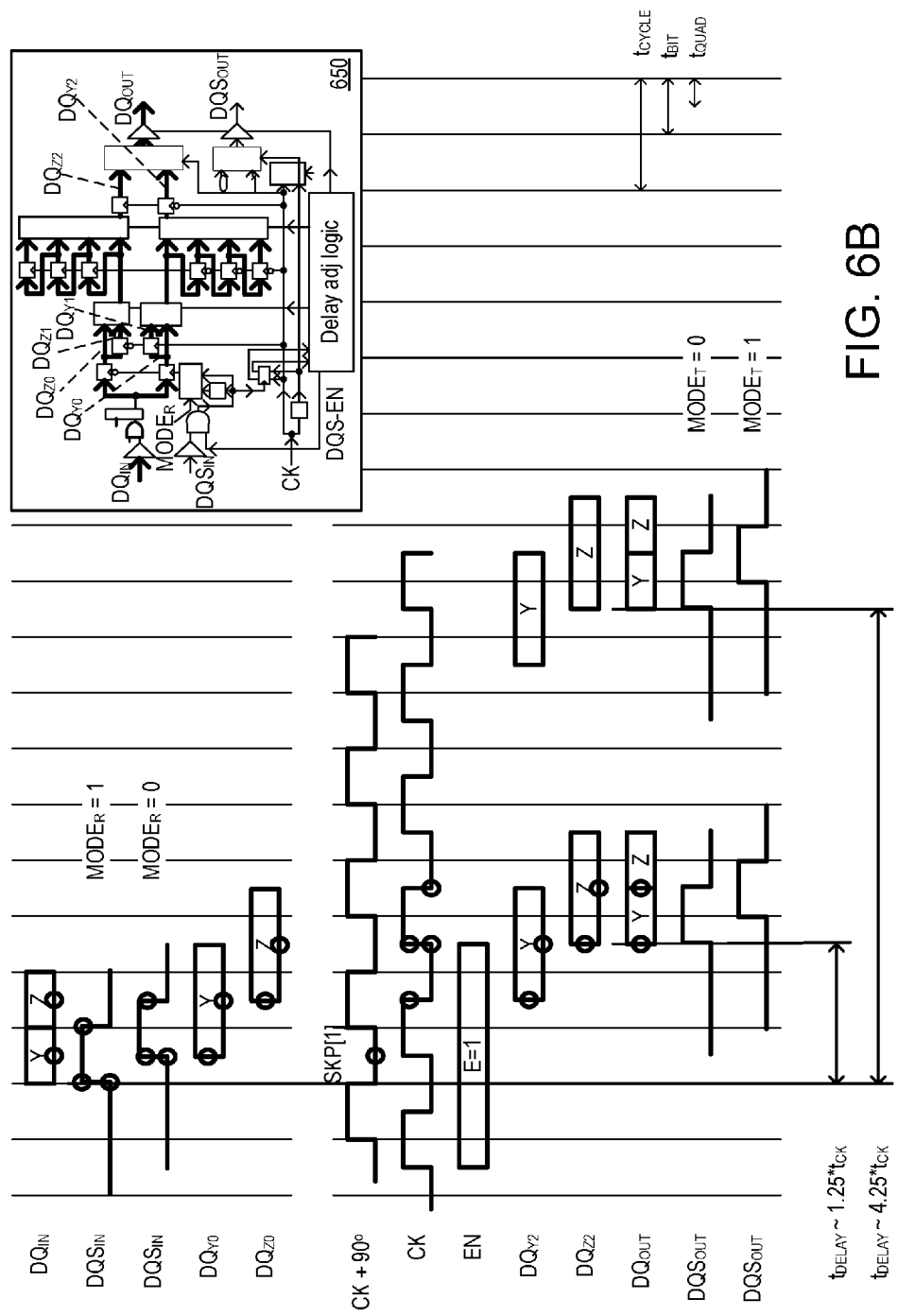
FIG. 6B shows the timing relationship of elements of diagram 650 of FIG. 6A.

FIG. 6B shows the timing relationship of elements of diagram 650 of FIG. 6A. Diagram 650 is reproduced at the upper right to identify circuit nodes with signal names. (In general, signal names and their respective nodes are referred to using the same designation. Whether a given reference is to a node, port, link, or signal name will be clear in context.) The top set of waveforms show the $DQ_{IN}$ and $DQS_{IN}$ timing relationship for the receive domain. When $MODE_R$ is one, $DQS_{IN}$ is edge-aligned; $DQS_{IN}$ and $DQ_{IN}$ make transitions which are approximately aligned (in-phase).

When $MODE_R$ is zero, $DQS_{IN}$ is center-aligned; $DQS_{IN}$ and $DQ_{IN}$ make transitions that are not aligned (out-of-phase). The misalignment is approximately 90°, meaning that $DQS_{IN}$ transitions are approximately midway between the $DQ_{IN}$ transitions. The component interface can receive data with either phase alignment. The center alignment is typically used for write data, and the edge alignment is typically used for read data. The DRAM component will transfer either read or write data from one interface to the other for some of the system configurations.

The bottom set of waveforms show the $DQ_{OUT}$ and $DQS_{OUT}$ timing relationship for the transmit domain. When $MODE_T$ is zero, strobe signal $DQS_{OUT}$ is edge-aligned; signals $DQS_{OUT}$ and $DQ_{OUT}$ make transitions that are approximately in-phase. When $MODE_T$ is one, $DQS_{OUT}$ is center-aligned; $DQS_{OUT}$ and $DQ_{OUT}$ make transitions that are misaligned by about 90°, meaning that $DQS_{OUT}$ transitions are approximately midway between the $DQ_{OUT}$ transitions.

The DRAM interface transmits data with either phase alignment. The center alignment is used for write data, and the edge alignment is used for read data. The DRAM transfers either read or write data from one interface to the other for some of the system configurations, so this modal configurability is needed.

Figure 6C:
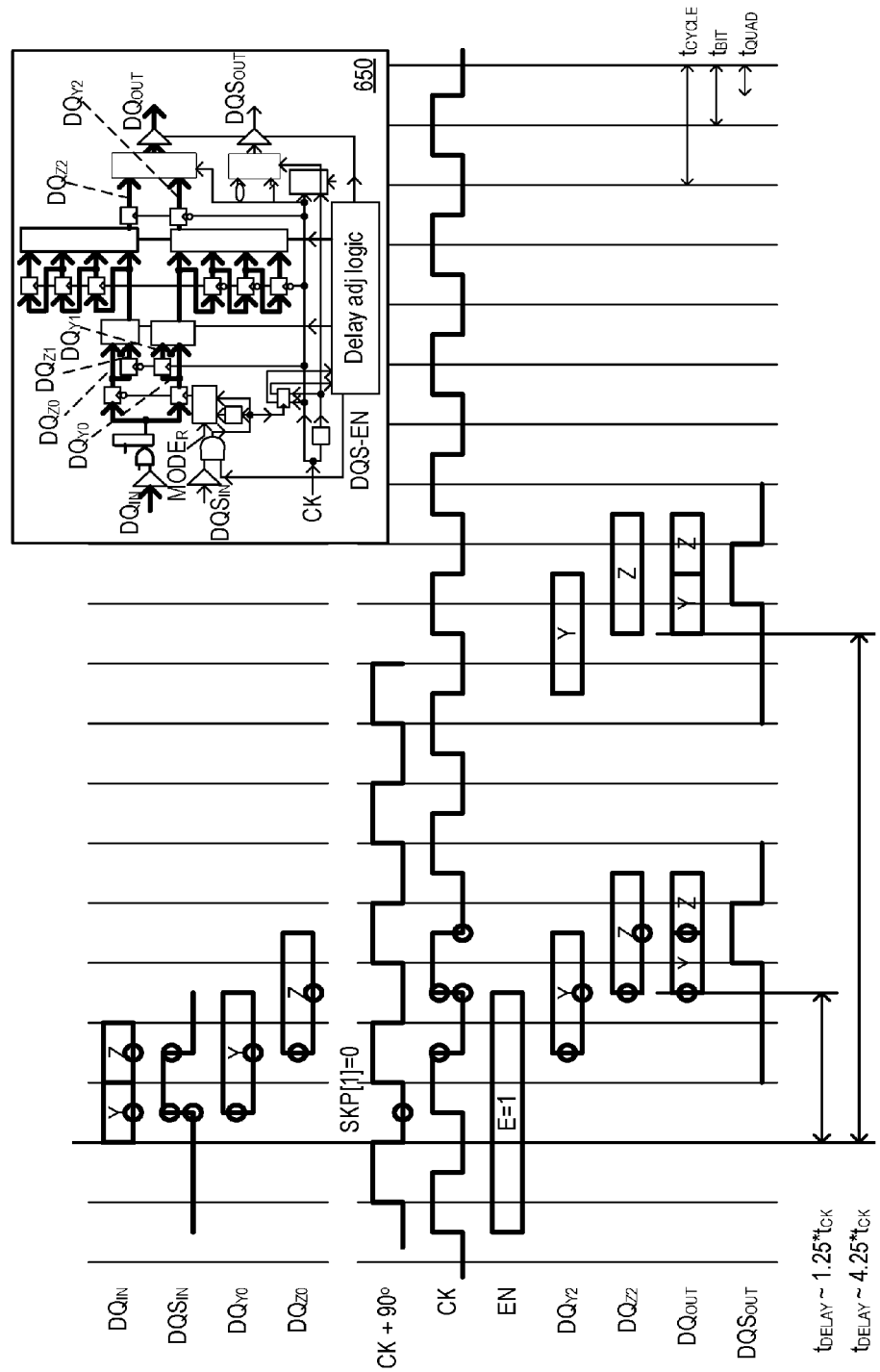
FIG. 6C shows the second order detail of the domain-crossing logic for the circuitry of diagram 650 of FIG. 6A.

FIG. 6C shows the second order detail of the domain-crossing logic for the circuitry of diagram 650 of FIG. 6A. The logic in this example has had control register fields (not shown) set to specific values to illustrate how the interface could be initially configured and maintained. Primary data signals $DQ_{IN}$ (the receive domain) is sampled by the primary timing link $DQS_{IN}$ at the rising and falling edges (because $MODE_R=0$, inserting zero degrees of delay into the DQS path). This results in two sampled values Y and Z held on the $DQ_{Y0}$ and $DQ_{Z0}$ register outputs in the DQS domain. Signal DQS-EN is formed in the CK domain and gates the $DQS_{IN}$ signal, and can be extended if the data transfer is longer.

This example assumes the DQS and CK signals are aligned so the SKP[1] value sampled from CK+90° by $DQS_{IN}$ is LOW. The DLY0.5 control value was set by the SKP[1] value on the previous WR transfer, so it will also be low. The low value on the DLY0.5 control causes the $DQ_{Y0}$ and $DQ_{Z0}$ values to be passed through the multiplexers in the phase adjustment block.

The value on the DLY123[1:0] control is assumed to be 00, which causes the $DQ_{Y0}$ and $DQ_{Z0}$ values to be passed through the multiplexers in cycle adjustment block 630, as well. The $DQ_{Y0}$ and $DQ_{Z0}$ values will be sampled by the $DQ_{Y2}$ and $DQ_{Z2}$ registers and will have crossed into the CK domain at this point. The $DQ_{Y2}$ and $DQ_{Z2}$ registers drive the output multiplexer, which in turn drives the output driver for port DQb.

Logic 640 produces strobe output $DQS_{OUT}$, which is driven using the CK+90° signal when the $MODE_T=1$ value causes 90 degrees of delay to be inserted to the $DQS_{OUT}$ value. If the value on the DLY123[1:0] control is assumed to be 11, the $DQ_{Y0}$ and $DQ_{Z0}$ values will be delayed by a three-cycle pipeline. The data and timing signals will appear on the secondary links 3*tCK later than for the previous case. This allows the delay through the DQS-to-CK domain crossing to be adjusted in one-cycle increments.

Figure 6D:
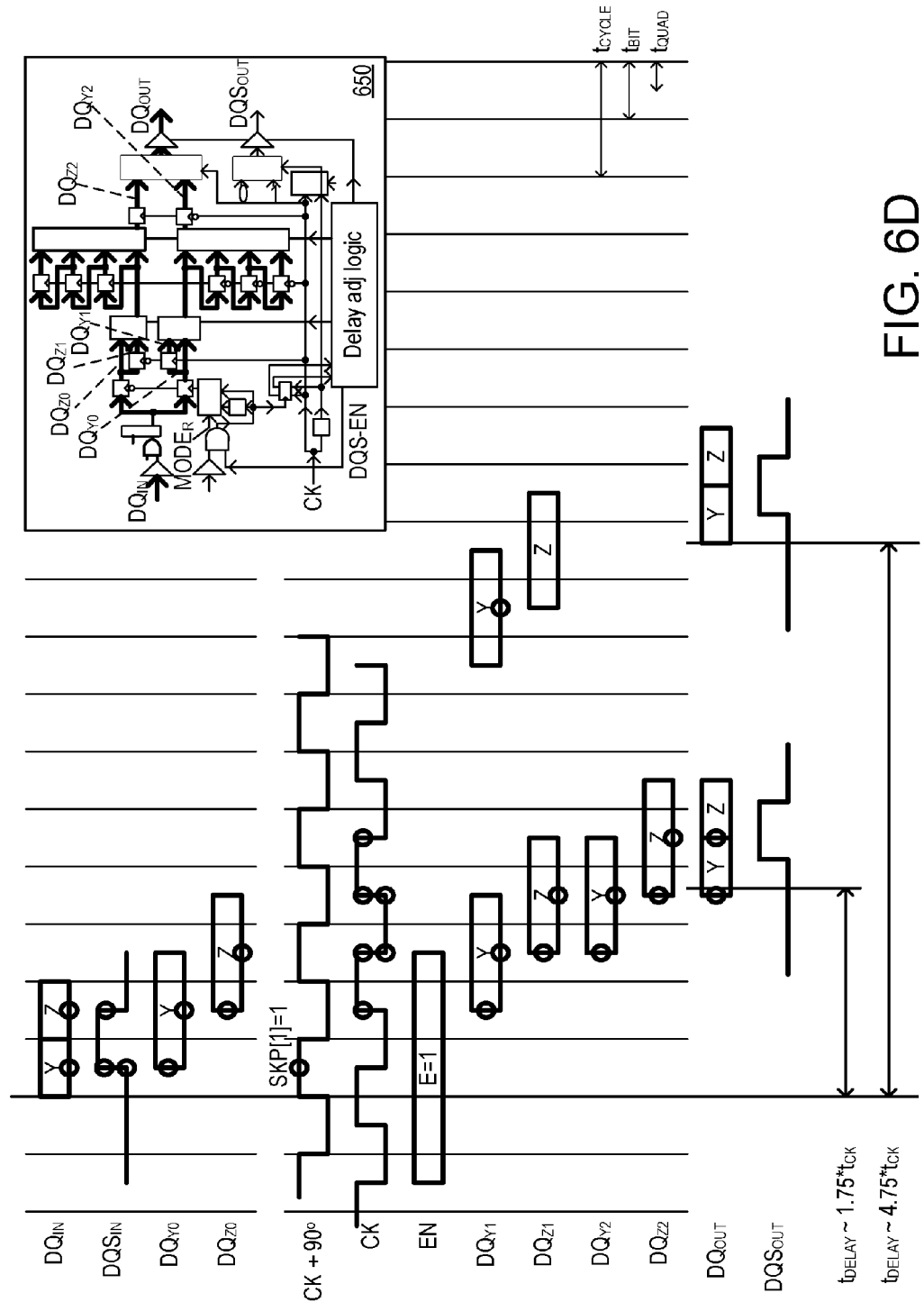
FIG. 6D is similar to FIG. 6C, except that it assumes the $DQS_{IN}$ and CK signals are not aligned so the SKP[1] value sampled from CK+90° by $DQS_{IN}$ is high.

FIG. 6D is similar to FIG. 6C, except that it assumes the $DQS_{IN}$ and CK signals are not aligned so the SKP[1] value sampled from CK+90° by $DQS_{IN}$ is high. The waveforms of six internal nodes are shown in the figure, along the primary data input and secondary data output signals. Each primary data link $DQ_{IN}$ is sampled by the primary timing link $DQS_{IN}$ at the rising and falling edges, resulting in two sampled values Y and Z held on the $DQ_{Y0}$ and $DQ_{Z0}$ register outputs in the $DQS_{IN}$ domain. The DQS-EN signal is formed in the CK domain and gates the $DQS_{IN}$ signal. It will be extended if the data transfer is longer.

A high value on the DLY0.5 control causes the $DQ_{Y0}$ and $DQ_{Z0}$ values to be sampled by the $DQ_{Y1}$ and $DQ_{Z1}$ registers and passed through the multiplexers in the phase adjustment block. The value on the DLY123[1:0] control is assumed to be 00, which causes the $DQ_{Y1}$ and $DQ_{Z1}$ values to be passed through the multiplexers in the cycle adjustment block. The $DQ_{Y1}$ and $DQ_{Z1}$ values will be sampled by the $DQ_{Y2}$ and $DQ_{Z2}$ registers and will have crossed into the CK domain at this point. The $DQ_{Y2}$ and $DQ_{Z2}$ registers drive the output multiplexer, which in turn drives the output driver for the secondary link group.

Signal $DQS_{OUT}$ is enabled by signal OUT-EN from logic 640, and is driven using the CK+90° signal, since the $MODE_T=1$. If the value on the DLY123[1:0] control is assumed to be 11, the $DQ_{Y0}$ and $DQ_{Z0}$ values will be delayed by a three-cycle pipeline. The data and timing signals appear on the secondary links 3*tCK later than for the previous case. This allows the delay through the DQS-to-CK domain crossing to be adjusted in one-cycle increments.

Figure 6E:
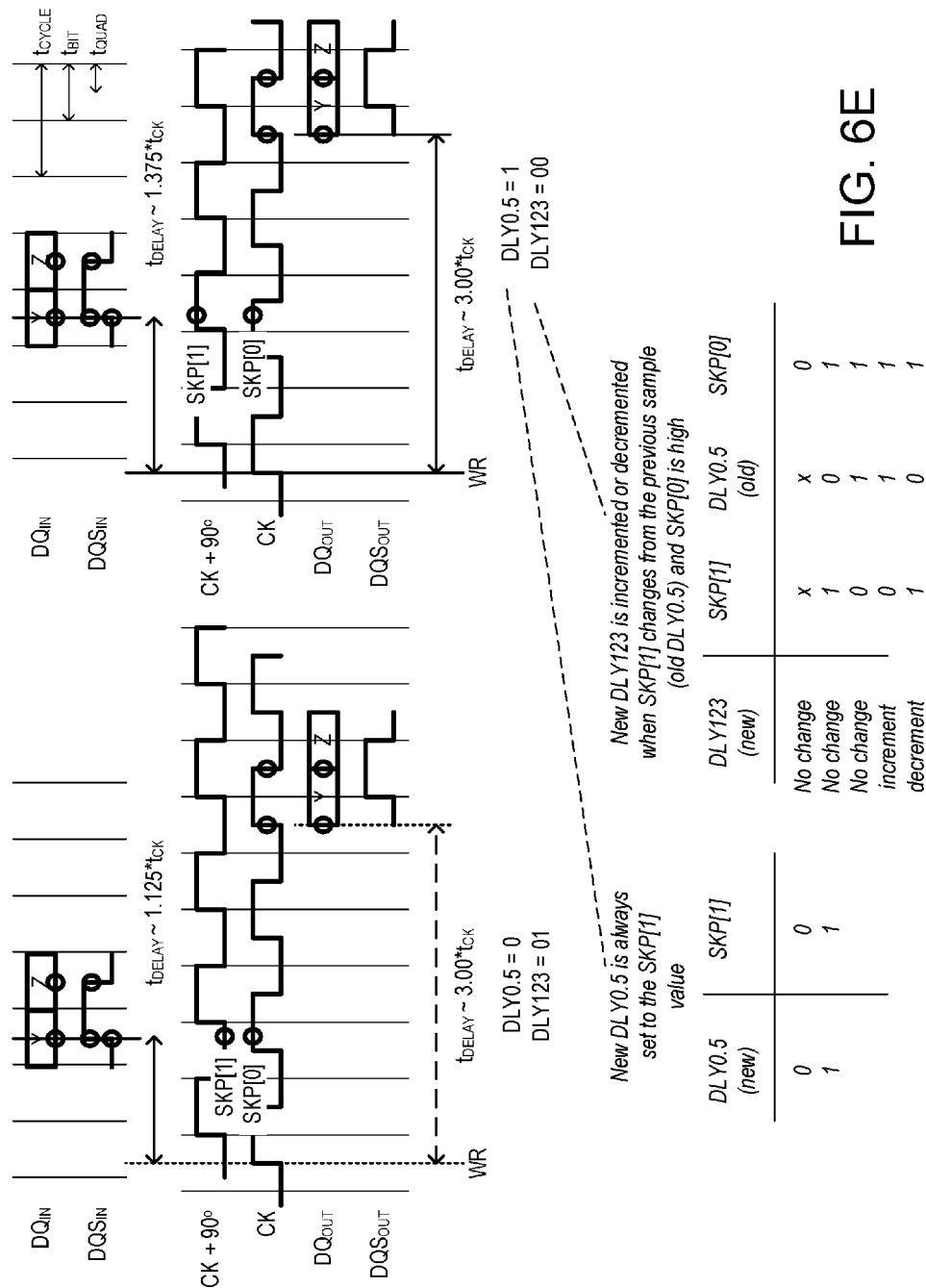
FIG. 6E is a waveform diagram illustrating how the timing examples of FIGS. 6C and 6D can be combined to automatically track drift between the $DQSI_N$ and CK domain over an arbitrarily large range.

FIG. 6E is a waveform diagram illustrating how the timing examples of FIGS. 6C and 6D can be combined to automatically track drift between the $DQSI_N$ and CK domain over an arbitrarily large range. This example assumes that the domain-crossing logic has been initialized so the delay from a column write command on the CA bus and the write data for that command is a constant 3.00*tCK (these values are smaller than would be seen in an actual system so they will fit in the timing diagram more easily).

In the left diagram, the write strobe arrives 1.125*tCK after the write command. The SKP[1:0] values that are sampled are "01". The new DLY0.5 phase value is set from SKP[1], and the new DLY123[1:0] cycle value is "01" (the same as what was previously set at initialization). In the right diagram, the $DQS_{IN}$ timing has drifted relative to the CK domain, so the write strobe arrives 1.375*tCK after the write command. The SKP[1:0] values that are sampled are "11".

The new DLY0.5 phase value is set from SKP[1]. Because the SKP[1] and the old DLY0.5 phase value are different, and because SKP[0] is high, the new DLY123[1:0] will increment or decrement (relative to old DLY123[1:0] value) to keep the command-to-data delay constant at 3.00 tCK (it will decrement in this example). In summary, the $DQS_{IN}$ timing signal for each transfer will sample the CK and CK+90° (in the case of a write) and retain this information in the SKP[1:0] register.

At the idle interval before the next transfer, the DLY0.5 and DLY123[1:0] values (held in a control register in the CK domain) can be updated to reflect the SKP[1:0] from the previous transfer. These new DLY0.5 and DLY123[1:0] values are used on the next transfer. This sequence will happen automatically on each transfer, and will allow the domain-crossing logic to accommodate an arbitrarily large range of DQS-to-CK drift during system operation. After an initialization process gets the control registers set to appropriate values, no further maintenance operations are required to support this automatic tracking.

In the foregoing description and in the accompanying drawings, specific terminology and drawing symbols have been set forth to provide a thorough understanding of the present invention. In some instances, the terminology and symbols may imply specific details that are not required to practice the invention.

For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

The term "memory" refers to electronic data storage systems, packages, devices, and collections of packages and devices used in computers. Computer memory commonly stores bits of binary data in arrays of memory cells form on an integrated circuit (IC) die and arranged in rows and columns. Component circuitry within these dies can be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

A signal driving circuit is said to "output" a signal to a signal receiving circuit when the signal driving circuit asserts (or de-asserts, if explicitly stated or indicated by context) the signal on a signal line coupled between the signal driving and signal receiving circuits. A line over a signal name is also used to indicate an active low signal. The term "coupled" is used herein to express a direct connection as well as a connection through one or more intervening circuits or structures.

Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. For these and other reasons, the spirit and scope of the appended claims should not be limited to the foregoing description. Moreover, only those claims specifically reciting "means for" or "step for" should be construed in the manner required under the sixth paragraph of 35 U.S.C. § 112.

What is claimed is:

1. A memory system supporting a normal mode and a fault mode, the memory system comprising:
    a controller component;
    a first data link extending from the controller component;
    a second data link electrically isolated from the controller component;
    a first memory module having a first dynamic, random-access memory (DRAM) package and supporting the normal mode and the fault mode, the first DRAM package including:
        a first data port coupled to the controller component via the first data link;
        a second data port coupled to the second data link; and
        a first package data interface coupled to the first data port and the second data port, the first package data interface disabling the first data port and communicating via the second data port in the fault mode;
    a third data link extending from the controller component;
    a second memory module having a second DRAM package and supporting the normal mode and the fault mode, the second DRAM package including:
        a third data port coupled to the controller component via the third data link;
        a fourth data port coupled to the second data link electrically isolated from the controller component; and
        a second package data interface selectively communicating between the third data port and the fourth data port in the fault mode.

2. The memory system of claim 1, further supporting a second fault mode, wherein the first package data interface selectively communicates between the first data port and the second data port in the second fault mode.

3. The memory system of claim 2, wherein the second package data interface disables the third data port and communicates via the fourth data port in the second fault mode.

4. The memory system of claim 1, wherein the first DRAM package includes a first DRAM component and a second DRAM component.

5. The memory system of claim 4, wherein:
    the first DRAM component includes a first component interface, coupled to the first data port, and a second component interface; and
    the second DRAM component includes a third component interface, coupled to the second data port, and a fourth component interface coupled to the second component interface.

6. The memory system of claim 4, wherein the first DRAM component includes multiple DRAM dies.

7. The memory system of claim 4, the first memory module further having a buffer component having a primary command interface, a first secondary command interface coupled to the first DRAM component, and a second secondary command interface coupled to the second DRAM component.

8. The memory system of claim 7, wherein the buffer component includes a mode register to store a value indicative of one of the normal mode and the fault mode.

9. The memory system of claim 1, wherein the controller component includes a register to store a value indicative of the normal mode or the fault mode.

10. A memory module supporting a normal mode and a fault mode, the memory module comprising:
    a memory component including:
        a first data port;
        a second data port; and
        data interfaces coupled to the first data port and the second data port, the data interfaces disabling the first data port and enabling the second data port in the normal mode, and routing data entering the first data port out through the second data port in the fault mode.

11. The memory module of claim 10, further comprising a mode register to store a mode value indicative of one of the normal mode and the fault mode.

12. The memory module of claim 10, further comprising a buffer component, coupled to the memory component, the buffer component to receive primary memory commands, derive secondary memory commands from the primary memory commands, and issue the secondary memory commands to the memory component.

13. The memory module of claim 10, further comprising:
    a second memory component having a third data port, coupled to the second data port, and a fourth data port.

14. The memory module of claim 13, wherein the second memory component includes memory dies.

15. The memory module of claim 13, further comprising a buffer component, coupled to the first-mentioned memory component and the second memory component, the buffer component to receive primary memory commands, derive secondary memory commands from the primary memory commands, and issue separate secondary memory commands to the first-mentioned memory component and the second memory component.

16. The memory module of claim 15, the buffer component including a mode register to store a value indicative of one of the normal mode and the fault mode.

17. A memory system supporting a normal mode and a fault mode, the memory system comprising:
    a controller component;
    a first data link extending from the controller component;
    a second data link electrically isolated from the controller component;
    a first memory module having first memory supporting the normal mode and the fault mode, the first memory including:
        a first data port coupled to the controller component via the first data link;
        a second data port coupled to the second data link; and means for disabling the first data port and communicating via the second data port in the fault mode;
a third data link extending from the controller component;
a second memory module having a second memory supporting the normal mode and the fault mode, the second memory including:
  a third data port coupled to the controller component via the third data link;
  a fourth data port coupled to the second data link electrically isolated from the controller component; and
  means for relaying data between the controller component and the first memory module via the second data link in the fault mode.

18. The memory system of claim 17, further supporting a second fault mode, wherein the means for disabling the first data port relays data between the controller component and the second memory module via the second data link in the second fault mode.

19. The memory system of claim 18, wherein the means for relaying data between the controller component and the first memory module via the second data link disables the third data port and communicates via the fourth data port in the second fault mode.

20. The memory system of claim 17, the first memory module further comprising means for storing a value indicative of one of the normal mode and the fault mode.

* * * * *